United States Patent
Sun

(10) Patent No.: US 9,959,808 B2
(45) Date of Patent: May 1, 2018

(54) PIXEL STRUCTURE AND DISPLAYING METHOD THEREOF, AND RELATED DISPLAY APPARATUS

(71) Applicant: BOE TECHNOLOGY GROUP CO., LTD, Beijing (CN)

(72) Inventor: Liang Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 63 days.

(21) Appl. No.: 15/032,217

(22) PCT Filed: Sep. 18, 2015

(86) PCT No.: PCT/CN2015/089921
§ 371 (c)(1),
(2) Date: Apr. 26, 2016

(87) PCT Pub. No.: WO2016/107218
PCT Pub. Date: Jul. 7, 2016

(65) Prior Publication Data
US 2016/0351116 A1 Dec. 1, 2016

(30) Foreign Application Priority Data
Dec. 30, 2014 (CN) .......................... 2014 1 0843256

(51) Int. Cl.
*G09G 3/3225* (2016.01)
*H01L 27/32* (2006.01)
(Continued)

(52) U.S. Cl.
CPC .......... *G09G 3/3225* (2013.01); *G09G 3/2003* (2013.01); *H01L 27/3216* (2013.01);
(Continued)

(58) Field of Classification Search
CPC ......... G09G 2320/0233; G09G 3/3225; G09G 2330/021; G09G 2300/0452;
(Continued)

(56) References Cited

U.S. PATENT DOCUMENTS 8,354,789 B2 1/2013 Kim et al.
2007/0002084 A1* 1/2007 Kimura ................ G09G 3/3241
345/694

(Continued)

FOREIGN PATENT DOCUMENTS

CN 102354702 A 2/2012
CN 103681754 A 3/2014
(Continued)

OTHER PUBLICATIONS

The State Intellectual Property Office of the People's Republic of China (SIPO) Office Action 1 for 201410843256.9 dated May 31, 2016.
The World Intellectual Property Organization (WIPO) International Search Report for PCT/CN2015/089921 dated Sep. 18, 2015.

*Primary Examiner* — Abhishek Sarma
(74) *Attorney, Agent, or Firm* — Anova Law Group, PLLC

(57) ABSTRACT

The present disclosure provides a pixel structure. The pixel structure includes first sub-pixels, second sub-pixels, and third sub-pixels. In the pixel structure, two adjacent third sub-pixels facing each other form a third sub-pixel group, the second sub-pixels are arranged along a direction of a first axis to form second-sub-pixel rows. The second sub-pixels are arranged along a direction of a second axis to form second-sub-pixel columns, the first sub-pixels and the third sub-pixel groups are arranged in an alternating configuration along the direction of the column axis, the second-sub-pixel columns and columns formed by the first sub-pixels and the third sub-pixel groups are arranged in an alternating con- (Continued)

figuration. Geometric center of each second sub-pixel is positioned on a perpendicular bisector of a line connecting centers of any two of adjacent third sub-pixel groups and first sub-pixels.

23 Claims, 16 Drawing Sheets

(51) Int. Cl.
    *G09G 3/20*     (2006.01)
    *H01L 51/00*     (2006.01)

(52) U.S. Cl.
    CPC ...... *H01L 27/3218* (2013.01); *H01L 27/3276* (2013.01); *H01L 51/0097* (2013.01); *G09G 2300/0452* (2013.01); *G09G 2320/0233* (2013.01); *G09G 2320/0295* (2013.01); *G09G 2330/021* (2013.01); *H01L 2251/5338* (2013.01)

(58) Field of Classification Search
    CPC ......... G09G 2320/0295; G09G 3/2003; H01L 27/3216; H01L 2251/5338; H01L 27/3276; H01L 27/3218; H01L 51/0097
    See application file for complete search history.

(56) References Cited

U.S. PATENT DOCUMENTS

| | | | |
|---|---|---|---|
| 2009/0121983 A1* | 5/2009 | Sung | H01L 27/3218 345/76 |
| 2011/0026095 A1 | 2/2011 | Kothari et al. | |
| 2012/0049726 A1* | 3/2012 | Yoo | H01L 27/3213 313/504 |
| 2012/0056531 A1* | 3/2012 | Park | H01L 51/5036 313/506 |
| 2015/0061978 A1* | 3/2015 | Shih | G09G 3/3225 345/76 |
| 2015/0270317 A1* | 9/2015 | Lee | H01L 27/3218 257/40 |
| 2016/0078807 A1* | 3/2016 | Sun | H01L 27/3216 345/204 |
| 2017/0059944 A1* | 3/2017 | Xu | G02F 1/1343 |

FOREIGN PATENT DOCUMENTS

| | | |
|---|---|---|
| CN | 104051493 A | 9/2014 |
| CN | 104269411 A | 1/2015 |
| CN | 104465714 A | 3/2015 |
| CN | 104466007 A | 3/2015 |
| WO | 02091349 A1 | 11/2002 |
| WO | 2014113079 A1 | 7/2014 |

* cited by examiner

PIXEL STRUCTURE AND DISPLAYING METHOD THEREOF, AND RELATED DISPLAY APPARATUS

CROSS-REFERENCES TO RELATED APPLICATIONS

This application is a national phase entry under 35 U.S.C. § 371 of International Application No. PCT/CN2015/089921, filed on Sep. 18, 2015, which claims priority to Chinese Patent Application No. 201410843256.9, filed on Dec. 30, 2014. The above enumerated patent applications are incorporated by reference herein in their entirety.

FIELD OF THE INVENTION

The present invention generally relates to the display technologies and, more particularly, relates to a pixel structure and display method thereof, and a display apparatus containing the same.

BACKGROUND

Flat-screen display apparatuses generally include LCD (Liquid Crystal Display) apparatuses and OLED (Organic Light-Emitting Diode) display apparatuses. Particularly, compared to an LCD, an OLED display has advantages such as being self-luminous, having faster response time, and providing a wider viewing angle. OLED displays are often suitable for flexible displays, transparent displays, three-dimensional displays, and many other display applications.

Currently, an FMM (Fine Metal Mask) is often applied in the process to manufacture top-emitting AMOLED (Active Matrix Organic Light-Emitting Diode) display panels. The FMM is often used in a deposition process for forming the organic light-emitting layer. Generally, the opening size of the FMM is often subjected to a restriction of minimum opening size. In the deposition process, a distance between sup-pixels for displaying a same color may be subjected to certain restrictions such that the distance between two sub-pixels for displaying one color may be different from the distance between two sub-pixels for displaying another color. As a result, the manufacturing of AMOLED display panels may be inevitably limited by the opening size of the FMM and the precision of the deposition process. It might be difficult to obtain high display resolution. Particularly, it may be difficult to realize the aperture ratios required by high resolutions. The aperture ratio of the display panel may even affect the product lifespan, display brightness, etc.

BRIEF SUMMARY OF THE DISCLOSURE

The present invention addresses the above problems in the prior art. The present disclosure provides a pixel structure, a method for displaying the pixel structure, and a display apparatus containing the pixel structure. The pixel structure can realize high resolution and improve the aperture ratio of the sub-pixels. The pixel structure can also simplify the back panel wiring and the manufacturing process. The display apparatus containing the pixel structure can have desirable display brightness and improved lifespan.

One aspect of the present disclosure provides a pixel structure. The pixel structure includes first sub-pixels, second sub-pixels, and third sub-pixels. In the pixel structure, two adjacent third sub-pixels facing each other form a third sub-pixel group, the second sub-pixels are arranged along a direction of a first axis to form second-sub-pixel rows, the first sub-pixels and the third sub-pixel groups are arranged in an alternating configuration along the direction of the first axis parallel to the second-sub-pixel rows, and the second-sub-pixel rows and rows formed by the first sub-pixels and the third sub-pixel groups are arranged in an alternating configuration. The second sub-pixels are arranged along a direction of a second axis to form second-sub-pixel columns, the first sub-pixels and the third sub-pixel groups are arranged in an alternating configuration along the direction of the second axis parallel to the second-sub-pixel columns, the second-sub-pixel columns and columns formed by the first sub-pixels and the third sub-pixel groups are arranged in an alternating configuration. Geometric center of each second sub-pixel is positioned on a perpendicular bisector of a line connecting centers of any two of adjacent third sub-pixel groups and first sub-pixels. At least two of the third sub-pixels neighboring the first sub-pixel and positioned on a same side of a central axis of the first sub-pixel are connected with direct connection lines to form a third sub-pixel string, the third sub-pixel groups displaying a same color. The first axis is different from the second axis.

Optionally, a diagonal direction is 45 degrees clockwise with the direction of the first axis, 45 degrees counter clockwise with the direction of the first axis, 45 degrees counter clockwise with the direction of the first axis, or 45 degrees counter clockwise with the direction of the second axis; geometric centers of the first sub-pixels in consecutive rows and consecutive columns are aligned to form lines along one of diagonal directions; geometric centers of the third sub-pixel groups in consecutive rows and consecutive columns are aligned to form lines along a diagonal direction parallel to lines formed by the geometric centers of the first sub-pixels such that the lines formed by the geometric centers of the first sub-pixels and lines formed by the geometric centers of third sub-pixel groups are arranged in an alternating configuration; each second sub-pixel is aligned between two adjacent first sub-pixels and two adjacent third sub-pixel groups, wherein the two adjacent first sub-pixels are aligned in one diagonal direction and the two adjacent third sub-pixel groups are aligned in another diagonal direction; and a geometric center of each second sub-pixel is arranged at an intersection of a perpendicular bisector of a line connecting geometric centers of adjacent first sub-pixel and third sub-pixel group in an adjacent row and a perpendicular bisector of a line connecting geometric centers of adjacent first sub-pixel and third sub-pixel group in an adjacent column.

Optionally, geometric centers of the first sub-pixels positioned in one row or one column are aligned along a straight line; geometric centers of the third sub-pixel groups positioned in one row or one column are aligned along a straight line; and geometric centers of the second sub-pixels positioned in one row or one column are aligned along a straight line.

Optionally, a display unit includes the first sub-pixel, the second sub-pixel adjacent to the first sub-pixel, and the third sub-pixel string neighboring the first sub-pixel, wherein adjacent display units share the first sub-pixel and the third sub-pixel string.

Optionally, the third sub-pixel string includes two neighboring third sub-pixels along a diagonal directions, wherein the two neighboring third sub-pixels each is contained in a different third sub-pixel group along the diagonal direction and the two neighboring third sub-pixels are positioned on two sides of the second sub-pixel in two adjacent rows and each having a shortest distance to the second sub-pixel along the diagonal direction; and the second sub-pixel, a third sub-pixel string having a shortest distance to the second sub-pixel, and two first sub-pixels positioned on two sides of the second sub-pixel in two adjacent rows and each having a shortest distance along a diagonal direction to the second sub-pixel form a display unit.

Optionally, the third sub-pixel string includes two neighboring third sub-pixels along a diagonal directions, wherein the two neighboring third sub-pixels each is contained in a different third sub-pixel group along the diagonal direction and the two neighboring third sub-pixels are positioned on two sides of the second sub-pixel in two adjacent columns and each having a shortest distance to the second sub-pixel along the diagonal direction; and the second sub-pixel, a third sub-pixel string having a shortest distance to the second sub-pixel, and two first sub-pixels positioned on two sides of the second sub-pixel in two adjacent columns and each having a shortest distance along a diagonal direction to the second sub-pixel form a display unit.

Optionally, two adjacent second sub-pixels positioned on two sides of the first sub-pixel and aligned along a diagonal direction have centrosymmetry about the geometric center of the first sub-pixel, two other adjacent second sub-pixels positioned on two sides of the first sub-pixel and aligned along another diagonal direction have centrosymmetry about the geometric center of the first sub-pixel, and four display units each includes one of the adjacent second sub-pixels share the first sub-pixel; and in the display unit, the third sub-pixel string neighboring the second sub-pixel is shared by an adjacent display unit in an upper adjacent row, an adjacent display unit in a lower adjacent row, or a combination of the upper adjacent row and the lower adjacent row.

Optionally, in the display unit, the third sub-pixel string neighboring the second sub-pixel is shared by an adjacent display unit in an upper adjacent column, an adjacent display unit in a lower adjacent column, or a combination of the upper adjacent column and the lower adjacent column.

Optionally, the three third sub-pixels are positioned on a same side of a central axis of the first sub-pixel, and each of the three third sub-pixels is contained in a different third sub-pixel group; two of the third sub-pixels are aligned along one diagonal direction, two of the third sub-pixels are aligned along the other diagonal direction, wherein one third sub-pixel is positioned on a crossing of two diagonal directions; and the second sub-pixel, two adjacent first sub-pixels positioned on two sides of the second sub-pixel in two adjacent rows and having the shortest distance to the second sub-pixel along a diagonal direction, and a third sub-pixel string with a shortest distance to the second sub-pixel forms a display unit.

Optionally, the third sub-pixel string neighboring the first sub-pixel includes: an adjacent third sub-pixel in a same row as the first sub-pixel, and two adjacent third sub-pixels in a same column on upper and lower sides of the first sub-pixel, where each of three neighboring third sub-pixels is contained in a different third sub-pixel group.

Optionally, the third sub-pixel string neighboring the first sub-pixel includes: a third sub-pixel positioned adjacent to and in a same row with a first sub-pixel positioned on one side of the display unit; and two third sub-pixels each positioned adjacent to another first sub-pixel in a same display unit, wherein the two third sub-pixels are positioned in two adjacent rows and each is contained in a different third sub-pixel group.

Optionally, the third sub-pixel string neighboring the first sub-pixel includes: an adjacent third sub-pixel in a same column as the first sub-pixel, and two adjacent third sub-pixels in a same row on upper and lower sides of the first sub-pixel, where each of three neighboring third sub-pixels is in a different third sub-pixel group.

Optionally, the third sub-pixel string neighboring the first sub-pixel includes: a third sub-pixel positioned adjacent to and in a same column with a first sub-pixel positioned on one side of the display unit; and two third sub-pixels each positioned adjacent to another first sub-pixel in a same display unit, wherein the two third sub-pixels are positioned in two adjacent columns and each is contained in a different third sub-pixel group.

Optionally, two second sub-pixels adjacent to the first sub-pixel aligned along a diagonal direction have centrosymmetry about a geometric center of the first sub-pixel, another two second sub-pixels adjacent to the first sub-pixel aligned along another other diagonal direction have centrosymmetry about the geometric center of the first sub-pixel, and four display units each containing one of the second sub-pixels share the first sub-pixel; and three third sub-pixels each containing one of three second sub-pixels share the third sub-pixel string, wherein the three second sub-pixels are aligned in a row adjacent to the third sub-pixel string or a column adjacent to the third sub-pixel string.

Optionally, two third sub-pixels of a same third sub-pixel group have mirror symmetry along the row axis or along the column axis and are positioned between two first sub-pixels; and two third sub-pixels positioned on two sides of a same first sub-pixel and in a same row or in a same column as the first sub-pixel have centrosymmetry or mirror symmetry about a geometric center of the first sub-pixel, wherein the two third sub-pixels each has a shortest distance to the first sub-pixel along the direction of the first axis or the second axis.

Optionally, two third sub-pixels of a same third sub-pixel group are positioned between adjacent two second sub-pixels along a diagonal direction and a line connecting geometric centers of the two third sub-pixels lies between the two third sub-pixels; and two third sub-pixels adjacent to the second sub-pixel along a diagonal direction has centrosymmetry or mirror symmetry about the geometric center of the second sub-pixel.

Optionally, a shape of the first sub-pixel, a shape of the third sub-pixel group, and a shape of the second sub-pixel each has an axis of symmetry; the axis of symmetry of the shape of the first sub-pixel extends along a direction parallel to the direction of the first axis or second axis, or along a diagonal direction; the axis of symmetry of the shape of the third sub-pixel group or a third sub-pixel extends along a direction parallel to the direction of the first axis or second axis, or along a diagonal direction; and the axis of symmetry of the shape of the second sub-pixel extends along a direction parallel to the direction of the first axis second axis or along a diagonal direction.

Optionally, an overall arrangement of the first sub-pixels form lines along a diagonal direction of 45 degrees or 135 degrees with the direction of the first axis; an overall arrangement of the second sub-pixels form lines along a diagonal direction of 45 degrees or 135 degrees with the direction of the first axis; and an overall arrangement of the third sub-pixel groups form lines along a diagonal direction of 45 degrees or 135 degrees with the direction of the first axis.

Optionally, each of the shape of a first sub-pixel, the shape of a second sub-pixel, the shape of a third sub-pixel, and the shape of the third sub-pixel group is any one of a circular shape, a triangular shape, a quadrilateral shape, an pentagonal shape, a hexagonal shape, an octagonal shape, or a combination thereof.

Optionally, the first sub-pixel has a quadrilateral shape, an octagonal shape, or a combination thereof the third sub-pixel has a triangular shape, a quadrilateral shape, or a combination thereof the third sub-pixel group containing two adjacent third sub-pixels facing each other has an overall shape of a quadrilateral shape, an octagonal shape, or a combination thereof; and the second sub-pixel has a quadrilateral shape, an octagonal shape, or a combination thereof.

Optionally, the first sub-pixel has a rhombic shape; the third sub-pixel has an isosceles triangle shape; the third sub-pixel group containing two adjacent third sub-pixels facing each other has an overall shape of a rhombic shape; and the second sub-pixel has a triangle shape.

Optionally, the first sub-pixel has a rhombic shape; the third sub-pixel has a rectangle shape; the third sub-pixel group formed by two adjacent third sub-pixels facing each other has an overall shape of a quadrilateral shape; and the second sub-pixel has a rectangular shape.

Optionally, turning angles of the quadrilateral shapes or octagonal shapes of the first sub-pixels, the second sub-pixels, and the third sub-pixel groups are chamfered.

Optionally, two second sub-pixels having a shortest distance along a direction of the first axis or second axis have same shapes.

Optionally, two second sub-pixels having a shortest distance along a direction of the first axis or second axis are symmetric about a perpendicular bisector of a line connecting geometric centers of the two second sub-pixels.

Optionally, geometric centers of the first sub-pixels, geometric centers of the second sub-pixels, and geometric centers of the third sub-pixel groups are uniformly distributed.

Optionally, an area of the first sub-pixel is equal to an area of the third sub-pixel group; and an area of the second sub-pixel is less than the area of the first sub-pixel.

Optionally, the area of the third sub-pixel group is greater than the area of the first sub-pixel; and the area of the first sub-pixel is greater than the area of the second sub-pixel.

Optionally, a color displayed by the first sub-pixel, a color displayed by the second sub-pixel, and a color displayed by the third sub-pixel group each is any one of red, green, and blue.

Optionally, the first sub-pixel displays red or blue, the second sub-pixel displays green, and the third sub-pixel group displays blue or red.

Optionally, each of the first sub-pixel, the third sub-pixel string, and the second sub-pixel is connected with a data line for receiving pixel display information; the third sub-pixels of a same third sub-pixel string receive a same display information or addressable electrode of each sub-pixel in the same third sub-pixel string are electrically connected.

Another aspect of the present disclosure provides a method for displaying the pixel structure. In the pixel structure, third sub-pixels positioned on a same side of a central axis of the first sub-pixel and neighboring the first sub-pixel form a third sub-pixel string, wherein the third sub-pixels in the third sub-pixel string display a same color; and a display unit includes the first sub-pixel, a second sub-pixel adjacent to the first sub-pixel, and the third sub-pixel string neighboring the first sub-pixel, wherein adjacent display units share the first sub-pixel and the third sub-pixel string such that each display unit displays pixel display information containing three colors.

Optionally, the method includes steps S1 to S3. In step S1, the pixel structure obtains theoretical brightness values for each pixel unit from the pixel display information, wherein the theoretical brightness values correspond to colors displayed by the first sub-pixel, the second sub-pixel, and the third sub-pixel string; in step S2, the pixel structure calculates actual brightness values of the first sub-pixel, the second sub-pixel, and the third sub-pixel string of each pixel unit; and in step S3, the pixel structure inputs the actual brightness value to the first sub-pixel, the second sub-pixel, and the third sub-pixel string of each pixel unit to display images.

Optionally, the actual brightness value of the first sub-pixel is calculated as a sum of weighted theoretical brightness value of each shared portion of the first sub-pixel; the actual brightness value of the second sub-pixel is the theoretical brightness value corresponding to the color displayed by the second sub-pixel; and the actual brightness value of the third sub-pixel string is calculated as a sum of weighted theoretical brightness values of each shared portion of the third sub-pixel string.

Optionally, four adjacent display units share one first sub-pixel, wherein a weight of each shared portion of the first sub-pixel corresponds to a theoretical brightness value of the shared portion and the weight is ¼.

Optionally, the third sub-pixel string includes two adjacent third sub-pixels along a diagonal direction, wherein each of the two adjacent third sub-pixels is contained in a different third sub-pixel group; the second sub-pixel, a third sub-pixel string having the shortest distance to the second sub-pixel, and two first sub-pixels positioned on two sides of the second sub-pixel in two adjacent rows and each having the shortest distance to the second sub-pixel along a diagonal direction form a display unit; the third sub-pixel string of the display unit neighboring the second sub-pixel is shared by an adjacent display unit in an upper adjacent display unit row, a lower adjacent display unit row, an upper adjacent display unit column, a lower adjacent display unit column, or a combination thereof; and a weight for the theoretical brightness value of each shared portion of the third sub-pixel in the third sub-pixel string is ½.

Optionally, the third sub-pixel string includes three sub-pixels neighboring a first sub-pixel, wherein the three third sub-pixels are positioned on a same side of a central axis of the first sub-pixel and each of the three third sub-pixels is contained in a different third sub-pixel group; two of the third sub-pixels are aligned along one diagonal direction, two of the third sub-pixels are aligned along another other diagonal direction, wherein one of the third sub-pixels is positioned on a crossing of two diagonal directions; the second sub-pixel, two adjacent first sub-pixels positioned on two sides of the second sub-pixel in two adjacent rows and each having a shortest distance to the second sub-pixel along a diagonal direction, and a third sub-pixel string having a shortest distance to the second sub-pixel forms a display unit; each of three second sub-pixels aligned in one row or one column and neighboring the third sub-pixel string is contained in a display unit, wherein each of the display units containing one of the three second sub-pixels share the third sub-pixel string by shared portion of the third sub-pixel string; and a weight of the theoretical brightness value for a color displayed by a shared portion of the third sub-pixel string in each of the three display units is ⅓.

Another aspect of the present disclosure provides a display apparatus. The display apparatus incorporates a pixel structure. The pixel structure includes first sub-pixels, second sub-pixels, and third sub-pixels. In the pixel structure, two adjacent third sub-pixels facing each other form a third sub-pixel group, the second sub-pixels are arranged along a direction of a first axis to form second-sub-pixel rows, the first sub-pixels and the third sub-pixel groups are arranged in an alternating configuration along the direction of the first axis, and the second-sub-pixel rows and rows formed by the first sub-pixels and the third sub-pixel groups are arranged in an alternating configuration. The second sub-pixels are arranged along a direction of a second axis to form second-sub-pixel columns, the first sub-pixels and the third sub-pixel groups are arranged in an alternating configuration along the direction of the second axis, the second-sub-pixel columns and columns formed by the first sub-pixels and the third sub-pixel groups are arranged in an alternating configuration. Geometric center of each second sub-pixel is positioned on a perpendicular bisector of a line connecting centers of any two of adjacent third sub-pixel groups and first sub-pixels.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

One aspect of the present disclosure provides a pixel structure.

Figure 1:
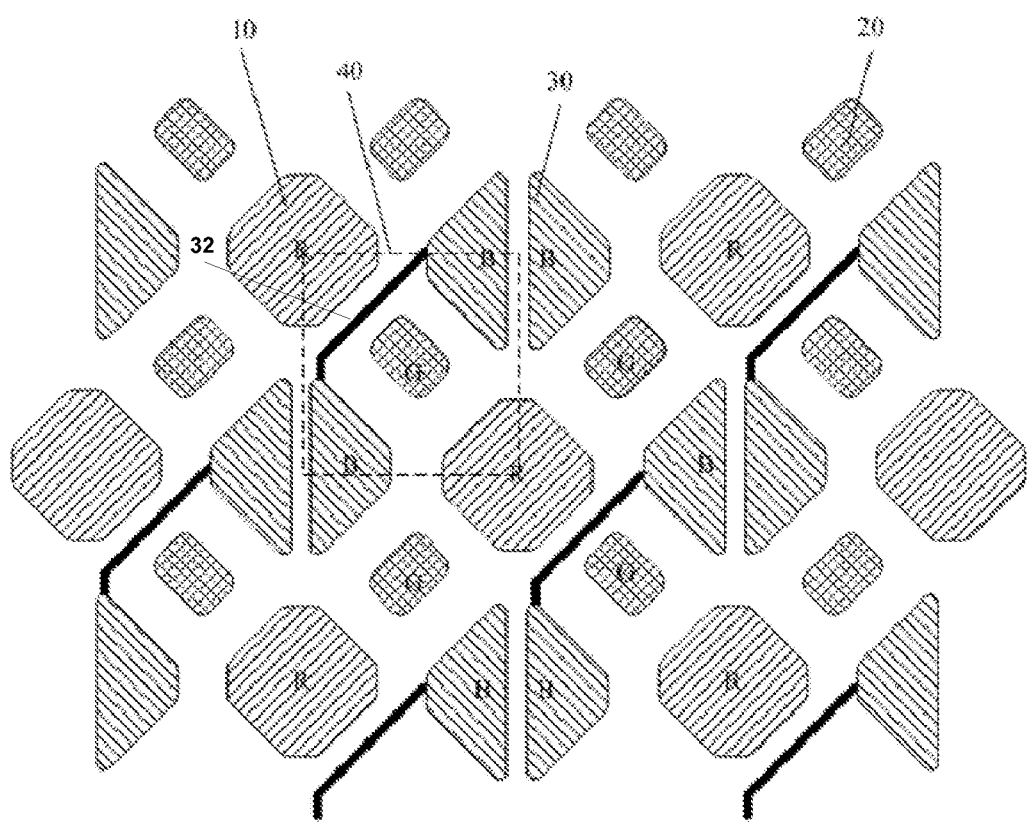
FIG. 1 illustrates schematics of an exemplary pixel structure in one embodiment of the present disclosure according to the disclosed embodiments.

Embodiment 1 provides a pixel structure. As shown in FIG. 1, the pixel structure may include first sub-pixels 10, second sub-pixels 20, and third sub-pixels 30. Meanwhile, referring to FIG. 2, two adjacent third sub-pixels 30, facing each other, may form a third sub-pixel group 31. The second sub-pixels 20 may be aligned to form second-sub-pixel rows in a direction of the row axis. The first sub-pixels 10 and the third sub-pixel groups 31 may be arranged in an alternating configuration along the direction of the row axis. For example, one first sub-pixel 10 may be positioned between two third sub-pixels 30 along the direction of the row axis (horizontally), and vice versa. The second-sub-pixel rows and the rows formed by the first sub-pixels 10 and the third sub-pixels 31 may be arranged in an alternating configuration. For example, one second-sub-pixel row may be positioned between two rows formed by the first sub-pixels 10 and the third sub-pixel groups 31, and vice versa. The second sub-pixels 20 may be aligned to form second-sub-pixel columns along a direction of the column axis (vertically). The first sub-pixels 10 and the third sub-pixel groups 31 may be arranged in an alternating configuration along the direction of the column axis. For example, one first sub-pixel 10 may be positioned between two third sub-pixels 30 along the direction of the column axis, and vice versa. The second-sub-pixel columns and the columns formed by the first sub-pixels 10 and the third sub-pixels 31 may be arranged in an alternating configuration. For example, one second-sub-pixel column may be positioned between two columns formed by the first sub-pixels 10 and the third sub-pixel groups 31, and vice versa. The geometric center of a second sub-pixel 20 may be positioned on the perpendicular bisector of the line connecting the geometric centers of any two of the adjacent first sub-pixels 10 and third sub-pixels 30 (i.e., the two first sub-pixels 10 and the two third sub-pixel groups 31 adjacent to the second sub-pixel 20).

The two opposing adjacent third sub-pixels 30 may refer to the two adjacent third sub-pixels 30 arranged facing/opposing each other along a direction of the vertical axis between the two third sub-pixels 30. The two third sub-pixels 30 may have the shortest distance in between. The sizes and shapes of the two third sub-pixels 30 may be substantially the same. The two third sub-pixels 30 may also have mirror symmetry, i.e., one of the third sub-pixels 30 is the mirror image of the other third sub-pixel 30. For example, if the two third sub-pixels 30 both move toward the vertical axis, the two third sub-pixels 30 may form a pattern with matching boundaries.

It is understandable that, according to certain manufacturing or design requirements, the two third sub-pixels 30 for forming a third sub-pixel group 31 may also have different shapes and/or different sizes. For example, one third sub-pixel 30 may have a greater size than the other third sub-pixel 30. Also, the two third sub-pixels 30 may have similar overall shapes but may be different from each other in some areas. For example, certain areas of the two third sub-pixels may have been removed or modified such that the two third sub-pixels 30 may have similar overall shapes but different shapes in certain areas. Other reasons may also cause the two third sub-pixels to have similar overall shapes but different shapes in certain areas. The two third sub-pixels with the features described above are also suitable for the manufacturing/design requirements of the third sub-pixels for forming the third sub-pixel group 31.

Figure 3:
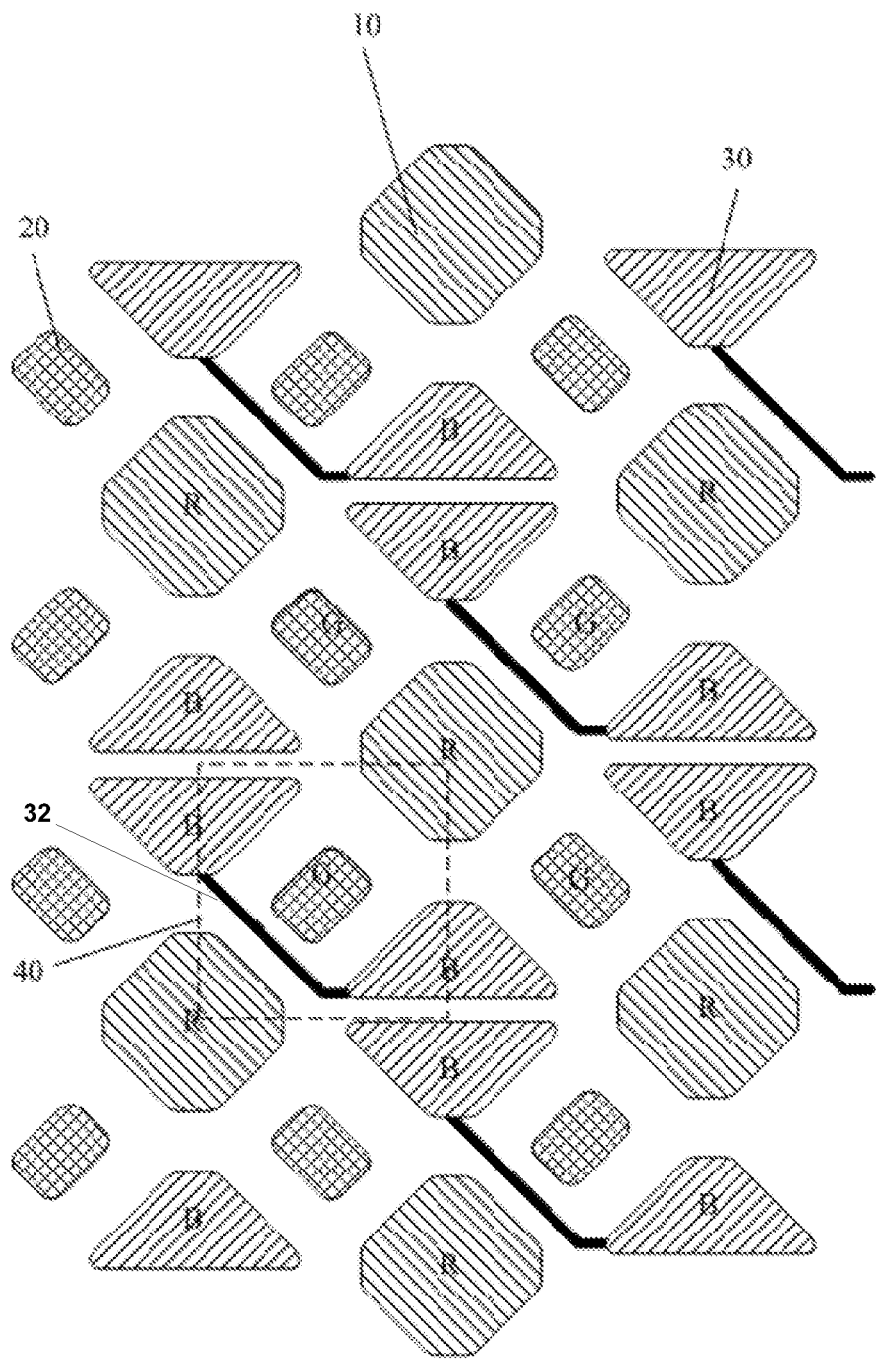
FIG. 3 illustrates schematics of the pixel structure of FIG. 1 with a rotation angle of 90 degrees according to the disclosed embodiments.

Meanwhile, two second sub-pixels 20, having the shortest distance along the direction of the row axis or along the direction of the column axis, may have the same shapes or have mirror symmetry about the perpendicular bisector of the line connecting the geometric centers of the two adjacent second sub-pixels 20. For example, in FIG. 1, the two second sub-pixels 20, having the shortest distance along the direction of the row axis, may have the same shapes and have mirror symmetry about the perpendicular bisector of the line connecting the geometric centers of the two adjacent second sub-pixels 20. According to various applications/embodiments, the pixel structure of FIG. 1 may be rotated for 90 degrees to form the pixel structure of FIG. 3. In FIG. 3, the two second sub-pixels 20, having the shortest distance along the direction of the column axis, may have the same shapes and have mirror symmetry about the perpendicular bisector of the line connecting the geometric centers of the two adjacent second sub-pixels 20.

It should be noted that, the shapes of the two second sub-pixels 20 as described may or may not be exactly the same, and the mirror symmetry may or may not be precise according to certain design/manufacturing process. All substantially similar configuration/arrangement of the second sub-pixels 20 are within the scope of the present disclosure. Meanwhile, in the present disclosure, limitations such as the mirror symmetry, certain features being the same, being aligned in a diagonal direction, and specific limitations on angles, sizes, and shapes only need to be approximate or similar. That is, the geometric relationships in the present disclosure may not need to be precise. According to requirements on design/manufacturing process, any suitable approximate/similar geometric relationships capable of representing the embodiments of the present disclosure are within the scope of the present disclosure.

In FIG. 1, the two adjacent third sub-pixels 30 in a third sub-pixel group 31, positioned between two first sub-pixels 10, may have mirror symmetry along the direction of the row axis. The two third sub-pixels 30, positioned on two sides of a first sub-pixel 10 in the same row and having the shortest distance along the direction of the row axis to the first sub-pixel 10, may have mirror symmetry or centrosymmetry about the geometric center of the first sub-pixel 10. A second sub-pixel 20 may be positioned in a diagonal direction with respect to the adjacent first sub-pixels 10 and third sub-pixel groups 31. Two second sub-pixels 20, having the shortest distance along the diagonal direction, may have mirror symmetry about the geometric center of the first sub-pixel 10 (or third sub-pixel group 31) between the two second sub-pixels 20.

Similarly, in FIG. 3, the two adjacent third sub-pixels 30 in a third sub-pixel group 31, positioned between two first sub-pixels 10, may have mirror symmetry along the direction of the column axis. The two third sub-pixels 30, positioned on two sides of a first sub-pixel 10 in the same column and having the shortest distance along the direction of the column axis to the first sub-pixel 10, may have mirror symmetry or centrosymmetry about the geometric center of the first sub-pixel 10. A second sub-pixel 20 may be positioned in a diagonal direction with respect to the adjacent first sub-pixels 10 and third sub-pixel groups 31. Two second sub-pixels 20, having the shortest distance along the diagonal direction, may have mirror symmetry about the geometric center of the first sub-pixel 10 (or third sub-pixel group) between the two second sub-pixels 20.

Figure 4:
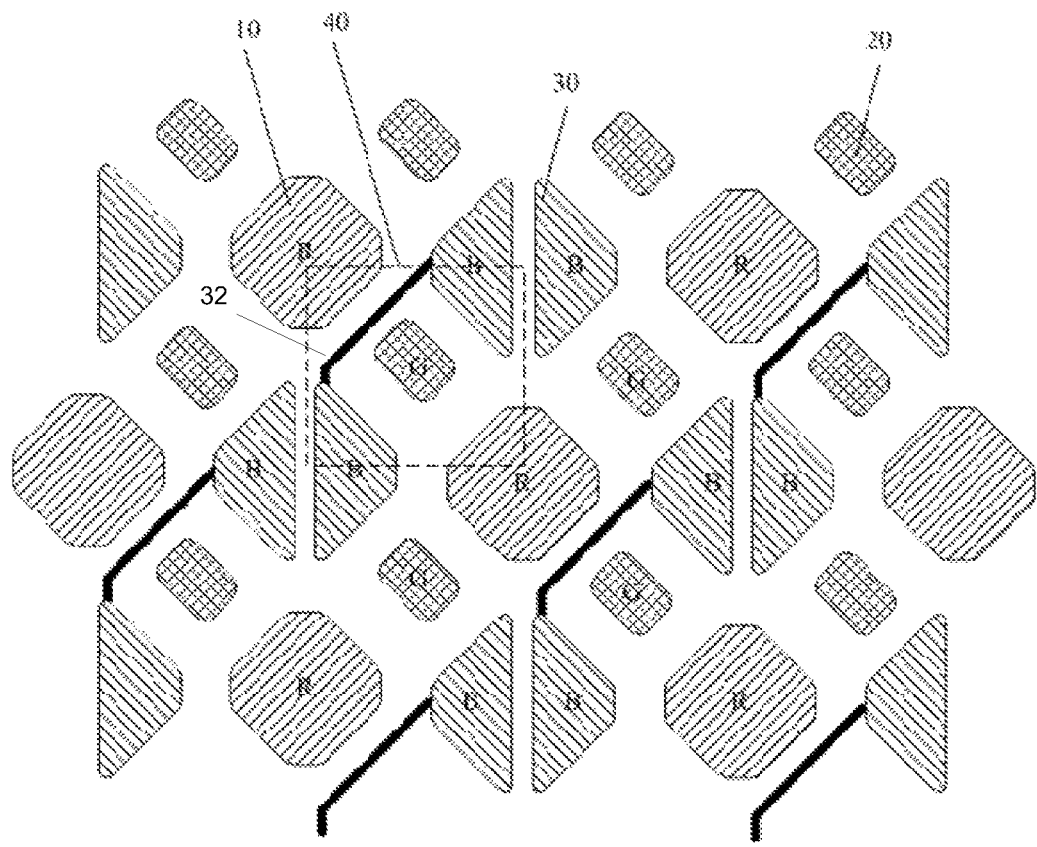
FIG. 4 illustrates schematics of another arrangement of the second sub-pixel in the pixel structure of FIG. 1 according to the disclosed embodiments.

In certain embodiments, the overall arrangement of the second sub-pixels 20 in the pixel structure illustrated in FIG. 1 may be modified. As shown in FIG. 4, a second sub-pixel 20 may be positioned in a diagonal direction with respect to the adjacent first sub-pixels 10 and third sub-pixel groups 31. Two second sub-pixels 20, having the shortest distance along the diagonal direction, may have the same orientation and relative position with respect to the adjacent first sub-pixels 10 (or third sub-pixel groups 31). It is understandable that, the pixel structure of FIG. 4 can also be rotated by 90 degrees to form a new pixel structure according to certain applications/embodiments and details are thus omitted herein.

Figure 5:
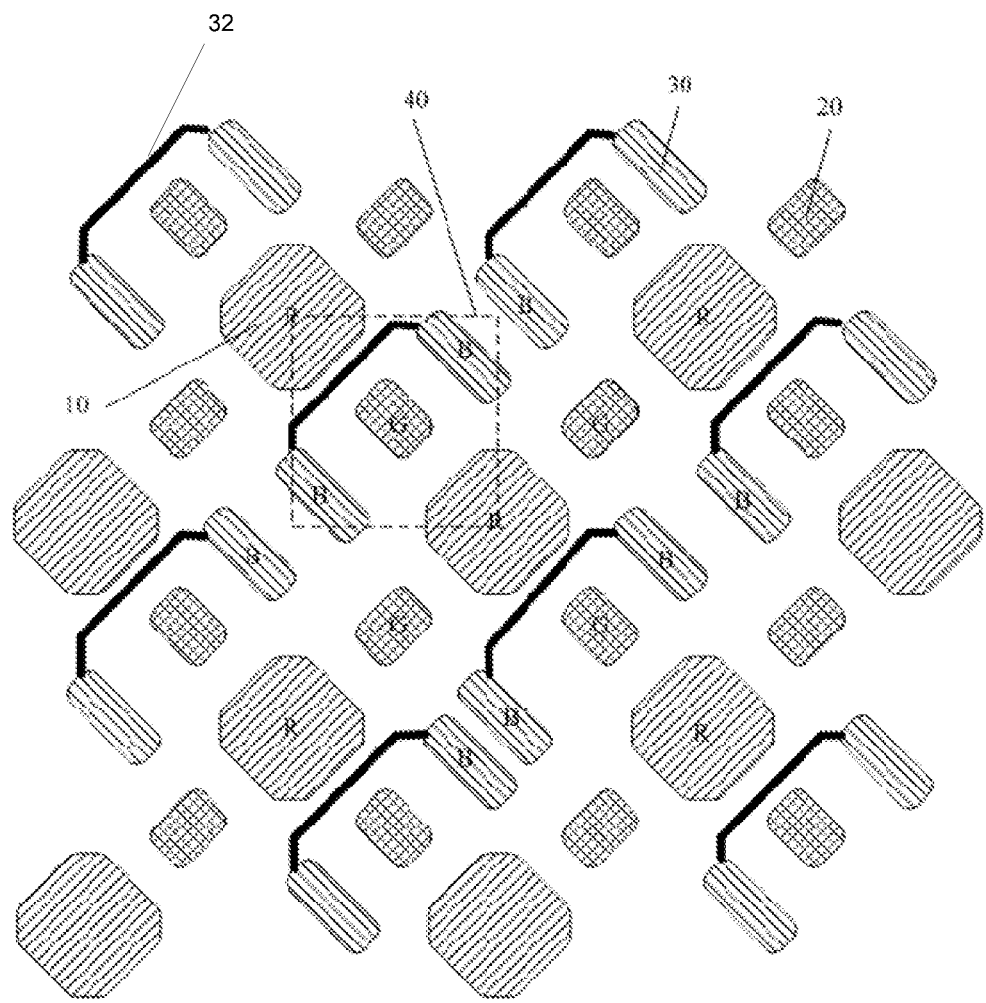
FIG. 5 illustrates schematics of another configuration of the pixel structure of FIG. 1 of according to the disclosed embodiments.

In certain embodiments, the overall arrangement of the third sub-pixels 30 in the pixel structure of FIG. 1 can be modified. As shown in FIG. 5, two adjacent third sub-pixels 30 in a same third sub-pixel group 31 may be positioned between the two second sub-pixels 20 adjacent to third sub-pixel group 31 in a diagonal direction. Two third sub-pixels 30, positioned on two sides of and adjacent to a second sub-pixel 20 along the diagonal direction, may have mirror symmetry or centrosymmetry about the geometric center of the second sub-pixel 20. That is, the distance between the geometric center of the second sub-pixel 20 and one point within the area defined by one of the third sub-pixels 30 may be the same as the distance between the geometric center of the second sub-pixel 20 and the corresponding point within the area defined by the other of the third sub-pixels 30 (alternatively, the geometric center of the second sub-pixel 20 may be positioned on the midpoint of the line connecting one point within the area defined by one of the third sub-pixels 30 and the corresponding point within the area defined by the other of the third sub-pixels 30).

Figure 6:
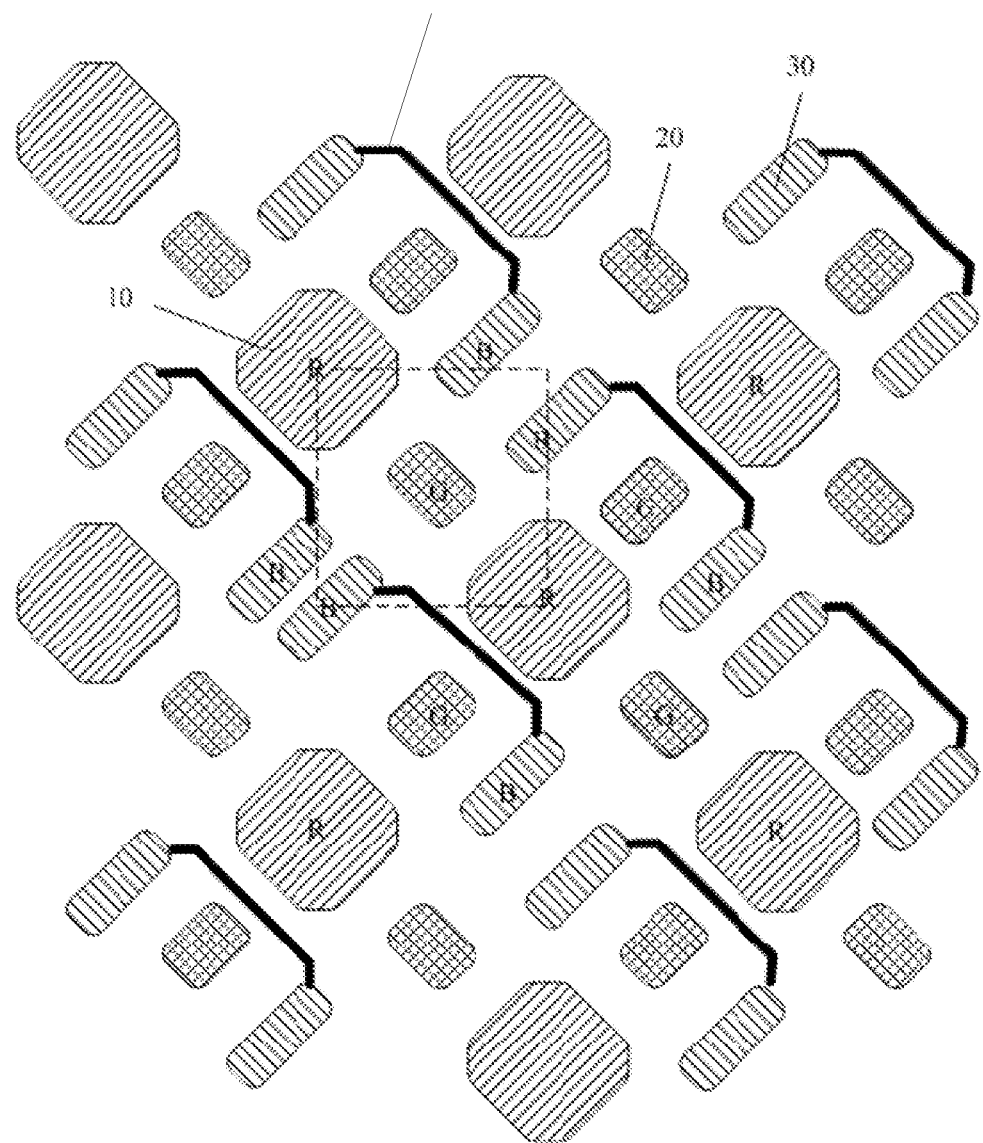
FIG. 6 illustrates schematics of the pixel structure of FIG. 5 with a rotation angle of 90 degrees according to the disclosed embodiments.

It is noted that, the pixel structure of FIG. 5 may be modified so that adjacent second sub-pixels 20 in FIG. 5 may have the same arrangement. That is, the second sub-pixels 20 in FIG. 5 may not have mirror symmetry about the geometric center of the first sub-pixel 10 (or the third sub-pixel group 31) between the second sub-pixels 20. However, each second sub-pixel 20 may have the same orientation and relative position with respect to the adjacent first sub-pixels 10 (or third sub-pixel groups 31) such that the second sub-pixels 20 with the same orientation form lines along a certain diagonal direction. Meanwhile, the pixel structure of FIG. 5 may also be rotated by 90 degrees to form a new pixel structure as shown in FIG. 6, and details are omitted herein.

In the pixel structures described above (i.e., FIGS. 1 to 6), geometric centers of the first sub-pixels 10 in consecutive rows and consecutive columns may align in lines along a diagonal direction different from the directions of the row axis and the column axis. That is, the first sub-pixels 10 may align accordingly in the same lines. Geometric centers of the third sub-pixel groups 31 in consecutive rows and consecutive columns may align in lines along the diagonal direction different from the directions of the row axis and the column axis. That is, the third sub-pixel groups 31 may align accordingly in the same lines. In the diagonal direction, the lines formed by the first sub-pixels 10 and the lines formed by the third sub-pixel groups 31 may be parallel and arranged in an alternating configuration such that one line formed by the first sub-pixels 10 may be arranged between two lines formed by the third sub-pixel groups 31, and vice versa.

In the diagonal direction, the second sub-pixels 20 may be positioned between adjacent lines formed by the first sub-pixels 10 and between adjacent lines formed by the third sub-pixel groups 31. The geometric center of a sub-pixel 20 may be positioned on the intersection of two bisectors, where one bisector may represent the perpendicular bisector of the line connecting the geometric centers of the adjacent first sub-pixel 10 and third sub-pixel group 31 in an adjacent row and the other bisector may represent the perpendicular bisector of the line connecting the geometric centers of the adjacent first sub-pixel 10 and third sub-pixel group 31 in an adjacent column.

The diagonal direction may refer to an angle of 45 degrees clockwise or counter clockwise with the direction of the row/column axis. An angle of 45 degrees counter clockwise with the direction of the row/column axis may refer to an angle of 135 degrees clockwise with the direction of the row/column axis. In the present disclosure, any diagonal direction may refer to one of the directions described above. Also, any line along a diagonal direction may refer to a line along one of the directions described above.

As shown in any one of FIG. 1 and FIGS. 3 to 6, all the first sub-pixels 10 in a pixel structure may be arranged in continuous lines along a diagonal direction, and all the third sub-pixel groups 31 in a pixel structure may be arranged in continuous lines along a diagonal direction. Along the diagonal direction, the lines formed by the first sub-pixels 10 and the lines formed by the third sub-pixels 31 may be parallel and arranged in an alternating configuration. For example, one line by the first sub-pixels 10 may be arranged between two lines formed by the third sub-pixels 31, and vice versa. Along the diagonal direction, the second sub-pixels 20 may be arranged between two adjacent lines formed by the first sub-pixels 10 and between two adjacent lines formed by the third sub-pixels 31. It should be understood that, it is only required that, the line representing the shortest distance between the boundaries of two adjacent sub-pixels of different types (e.g., a second sub-pixel 20 and an adjacent first sub-pixel 10) aligned in a line along a diagonal direction forms an acute angle (i.e., an angle greater than 0 degrees and less than 90 degrees) with the horizontal direction (i.e., the direction of the row axis). In some embodiments, an angle of 45 degrees may be used to meet the distance/spacing limitation between openings of the FMM to improve the manufacturing process.

The geometric centers of the first sub-pixels 10 in a same row or in a same column may be aligned along a straight line. The geometric centers of the third sub-pixel groups 31 in a same row or a same column may be aligned along a straight line. The geometric centers of the second sub-pixels 20 in a same row or a same column may be aligned along a straight line. The arrangement described above may simplify the manufacturing process of the pixel structure.

To ensure uniform display effect, the geometric centers of the first sub-pixels 10, the geometric centers of the second sub-pixels 20, and the geometric centers of the third sub-pixel groups 31 may be distributed uniformly in a pixel structure. That is, the first sub-pixels 10, the second sub-pixels 20, and the third sub-pixels 31 may be distributed uniformly in a pixel structure. The arrangement described above may enable the sub-pixels for displaying different colors to be distributed uniformly on the pixel structure. The display quality can be improved.

Figure 2:
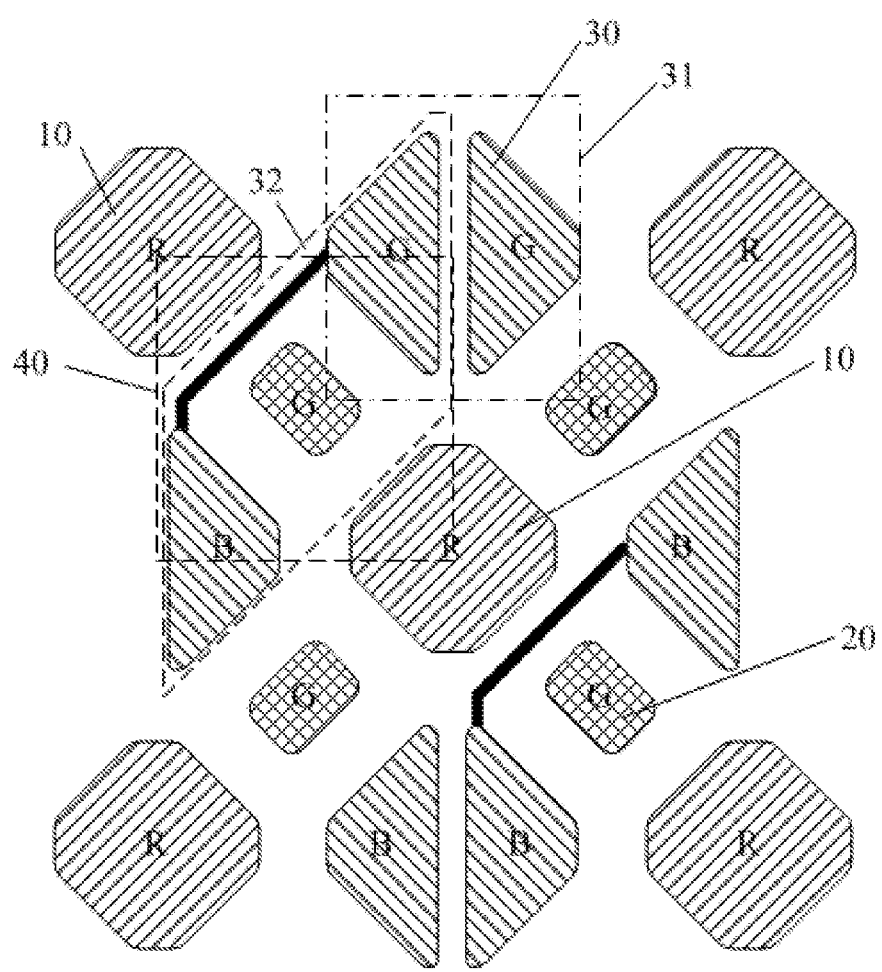
FIG. 2 illustrates enlarged schematics of the pixel structure of FIG. 1 according to the disclosed embodiments.

As shown in FIG. 2, the at least two neighboring third sub-pixels 30 on one side of central axis of a first sub-pixel 10, may form a third sub-pixel string 32 (circled in dashed lines and indicated by lines in other figures of the disclosure). The third sub-pixels 30 in the third sub-pixel string 32 may display the same color. A display unit 40 may include two first sub-pixels 10, a second sub-pixel 20 adjacent to the first sub-pixels 10, and a third sub-pixel string 32 neighboring the first sub-pixel 10. The display unit 40 may share the two first sub-pixels 10 and the third sub-pixel string 32 with adjacent (i.e., surrounding display units 40). Specifically, a third sub-pixel string 32 may include at least two third sub-pixels 30. For illustration purposes, the third sub-pixel string 32 illustrated in the present disclosure may include two third sub-pixels 30 or three third sub-pixels 30. In practice, the number and positions of third sub-pixels 30 in one third sub-pixel string 32 are not limited to the embodiments shown here and can be adjusted according to requirements in the design/manufacturing process, for example, to accommodate wiring requirements and algorithm.

Figure 7:
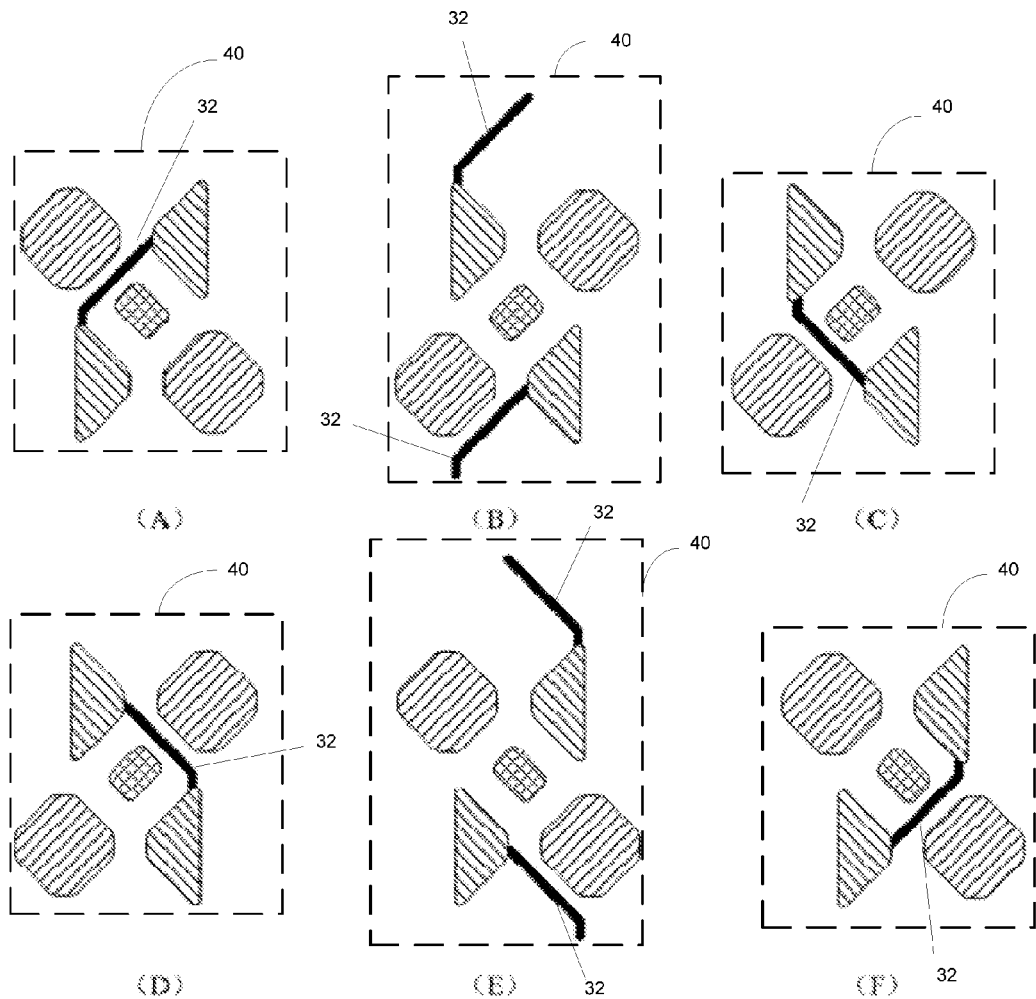
FIG. 7 illustrates schematics of different arrangements of display units of the pixel structure of FIG. 1 according to the disclosed embodiments.

As shown in FIG. 1, FIGS. 3 to 6, and FIGS. 7 to 15, a display unit 40 is shown in a dashed box (no real boundaries in an actual pixel structure). Consecutive display units 40 may form consecutive display unit rows along the direction of the row axis and consecutive display unit columns along the direction of the column axis. Based on the sub-pixels shared by display units, sub-pixels in a pixel structure can be divided according to a plurality of different arrangements. FIG. 7 illustrates display units 40 with a plurality of different arrangements. Each of the display unit 40 may represent a different configuration/arrangement of the sub-pixels in the display unit 40 sharing sub-pixels with adjacent display units 40. Each display unit 40 in FIG. 7 may share the first sub-pixels 10 and the third sub-pixel string 32 with adjacent display units 40. The position of an adjacent pixel unit 40, sharing the first sub-pixels 10 and/or the third sub-pixel string 32, may be dependent on the positions of the first sub-pixels 10 and the third sub-pixels 30 within the display unit 40.

Specifically, a third sub-pixel string 32 may include two neighboring third sub-pixels 30 along a diagonal direction. Each of the third sub-pixels 30 may form a third sub-pixel group 31 with another third sub-pixel 30. The two neighboring third sub-pixels 30 may be positioned on two sides of the second sub-pixel 20 along a diagonal direction. Each of the two neighboring third sub-pixels 30 may be in a row adjacent to the second sub-pixel 20 and has the shortest distance to the second sub-pixel 20 along the diagonal direction. Referring to FIG. 2, two third sub-pixels 30 connected with a line may form one third sub-pixel string 32. A second sub-pixel 20, a third sub-pixel string 32 having a shortest distance to the second sub-pixel 20, and the two first sub-pixels 10 positioned on two sides of the second sub-pixel 20 may form a display unit 40. The two first sub-pixels 10 may each be in an adjacent row and each having a shortest distance to the second sub-pixel 20 along a diagonal direction.

In FIGS. 7, (A), (C), (D), and (F) each illustrates a structure of a display unit 40. Each of the display units includes a third sub-pixel string 32 formed by two third sub-pixels 30 with direct connection (i.e., the third sub-pixels are directly connected). Direction connection refers to the connection between objects formed by direct wiring instead of being formed through algorithms and/or indirect wiring through back panel wiring. (B) and (E) in FIG. 7 each illustrates a structure of a display unit 40 with adjacent display unit rows (i.e., the upper adjacent display unit row and/or the lower adjacent display unit row). Each of the third sub-pixels 30 in the display unit 40 (i.e., in (B) and (E)), can be directly connected to a third sub-pixel 30 of another display unit 40 in the adjacent row (i.e., the upper adjacent display unit row and/or the lower adjacent display unit row) to form a third sub-pixel string. That is, the third sub-pixel 30 may form direction connection with another display unit 40 in the adjacent row. As shown in (B) and (E), the display units 40 can display the color of the third sub-pixel through the third sub-pixel string connecting the display unit 40 and the adjacent display unit 40 in the upper display unit row, or through the third sub-pixel string connecting the display unit 40 and the adjacent display unit 40 in the lower display unit row. The display unit 40 can also display the color of the third sub-pixel through a third sub-pixel string connecting the display unit 40 and the adjacent display units 40 in the upper display unit row and the lower display unit row simultaneously.

FIG. 3 illustrates a pixel structure modified from the pixel structure illustrated in FIG. 1. In FIG. 3, a third sub-pixel string 32 (shown by two third sub-pixels connected with a line) may refer to two adjacent third sub-pixels 30 aligned along a diagonal direction. The two adjacent third sub-pixels 30 may be positioned on two sides of a second sub-pixel 20 along a diagonal direction and each of the two third sub-pixels 30 is contained in a different third sub-pixel group 31 (not shown) adjacent to the second sub-pixel 20. One of the two adjacent third sub-pixels 30 may be positioned in the upper adjacent column and the other may be positioned in the lower adjacent column. Each of the two adjacent third sub-pixels 30 may have the shortest distance to the second sub-pixel 20 along the diagonal direction. A second sub-pixel 20, a third sub-pixel string 32 with the shortest distance to the second sub-pixel 20, and the two first sub-pixels 10 positioned in adjacent columns on two sides of the second sub-pixel 20 may form a display unit 40. The two first sub-pixels 10 may each have a shortest distance to the second sub-pixel 20 along the diagonal direction.

In the pixel structures described above, by sharing sub-pixels between adjacent display units, high display resolution can be realized. Meanwhile, the aperture ratio of the sub-pixels can be improved and the manufacturing process for forming the pixel structures may be simplified. Display brightness and product lifespan may be improved.

In one embodiment, four second sub-pixels 20 may each be adjacent to a same first sub-pixel 10 along a diagonal direction. Of the four second sub-pixels 20, two aligned along a diagonal direction may have centrosymmetry about the geometric center of the first sub-pixel 10, the other two aligned along the other diagonal direction may also have centrosymmetry about the geometric center of the first sub-pixel 10. The four display units 40, each including one of the second sub-pixel 20, may share the first sub-pixel 10. In one display unit 40, the third sub-pixel group 32 neighboring the second sub-pixel 20 (connected with a line) may be shared by adjacent display units 40 in the upper adjacent display unit row and/or in the lower adjacent display unit row. Alternatively, in one display unit 40, the third sub-pixel string 32 neighboring the second sub-pixel 20 (connected by a line) may be shared by adjacent display units 40 in the upper/right adjacent display unit column and/or in the lower/left adjacent display unit column.

For example, four adjacent display units 40, positioned in two adjacent columns of two adjacent rows, may form a 2 by 2 block shape. The four adjacent display units may include five first sub-pixels 10. The first sub-pixel 10 positioned in the center may be adjacent to the second sub-pixel 20 of the four display unit 40 along a diagonal direction. Of the four second sub-pixels 20, two aligned along a diagonal direction may have centrosymmetry about the geometric center of the first sub-pixel 10 in the center, and the other two aligned along the other diagonal direction may also have centrosymmetry about the geometric center of the first sub-pixel 10 in the center. The first sub-pixel 10 may be shared by the four display units 40. Each of the four first sub-pixels 10 positioned at the four corners of the color gamut area formed by the four display units 40 may be shared by adjacent display units 40 in the adjacent (upper and/or lower) display unit rows.

In one embodiment, the shape of the first sub-pixel 10, the shape of the third sub-pixel group 31, and the shape of the second sub-pixel 20 may each be a symmetrical shape, e.g., have at least an axis of symmetry. The axis of symmetry of the shape of a first sub-pixel 10 may extend along a direction parallel to the direction of the row axis or column axis, or along a diagonal direction (as shown in FIG. 1 and FIGS. 3 to 6). The axis of symmetry of the shape of a third sub-pixel group 31 or a third sub-pixel 30 may extend along a direction parallel to the direction of the row axis (as shown in FIG. 3) or column axis (as shown in FIGS. 1 and 4), or along a diagonal direction (as shown in FIGS. 5 and 6). The axis of symmetry of the shape of a second sub-pixel 20 may extend along a direction parallel to the direction of the row axis (as shown in FIG. 1 and FIGS. 3 to 6, when the shape of the second sub-pixel 20 is a square, a rhombus, a circle, and/or other suitable regular polygons) or column axis (as shown in FIG. 1 and FIGS. 3 to 6, when the shape of the second sub-pixel 20 is a square, a rhombus, a circle, and/or other suitable polygons), or along a diagonal direction (as shown in FIG. 1 and FIGS. 3 to 6). Thus, the overall arrangement of the first sub-pixels 10, the second sub-pixels 20, and the third sub-pixel groups 31 may form a structure/pattern with axes of symmetries. In the manufacturing process, when applying the FMM to form the pixel structure, the FMM is often stretched along the direction of the row axis and/or column axis. Since the axes of symmetries of the pattern/structure may be parallel along the direction of row axis and/or column axis, the FMM may not be deformed during the manufacturing process. The shapes of the sub-pixels may not be distorted. Thus, the arrangement/designs described above may ensure the positions of the sub-pixels in the pixel structure to remain accurate.

In the pixel structures described above, to simplify the wiring of the display panel and manufacturing process of masks, the turning angles of certain shapes (e.g., quadrilaterals or octagonal) of the sub-pixels (e.g., the first sub-pixels 10, the second sub-pixels 20, and/or the third sub-pixel groups 31) may be chamfered to improve independent color displays between the sub-pixels.

In one embodiment, the overall arrangement of the first sub-pixels 10 may form lines along a diagonal direction of 45 degrees or 135 degrees with the direction of the row axis. The overall arrangement of the second sub-pixels 20 may form lines along a diagonal direction of 45 degrees or 135 degrees with the direction of the row axis. The overall arrangement of the third sub-pixel groups 31 and/or the third sub-pixels 30 may form lines along a diagonal direction of 45 degrees or 135 degrees with the direction of the row axis. That is, a second sub-pixel 20 may be positioned between two adjacent first sub-pixels 10 and between two adjacent third sub-pixel groups 31. Each second sub-pixel 20 may be positioned in a diagonal direction of 45 degrees with respect to an adjacent first sub-pixel 10 (or third sub-pixel group 31). The diagonal direction of 45 degrees may refer to the angle between the line connecting the geometric centers of the second sub-pixel 20 and an adjacent first sub-pixel 10 (or third sub-pixel group 31) and the direction of the row axis. The diagonal direction may refer to an angle of 45 degrees in the upper left with the direction of the row axis, an angle of 45 degrees in the upper right with the direction of the row axis, an angle of 45 degrees in the lower left with the direction of the row axis, and/or an angle of 45 degrees in the lower right with the direction of the row axis.

The pixel structures described above may include a line of single sub-pixels (e.g., a line of only second sub-pixels 20) or a column of single sub-pixels on the edges of the pixel structures. A single sub-pixel may form a display unit 40 with sub-pixels in the adjacent rows or columns to display images. The display unit 40 may include three sub-pixels. By applying appropriate edge detection algorithms, desirable display effect can be obtained. The processing of the sub-pixels on the edges of the pixel structure is not limited to the embodiments disclosed here.

The first sub-pixel 10, the third sub-pixel group 31, the third sub-pixel 30, and the second sub-pixel 20 may each have a circular shape, a triangular shape, a quadrilateral shape, a pentagonal shape, a hexagonal shape, and/or octagonal shape. The shape of a sub-pixel may be determined according to manufacturing/design requirements. In one embodiment, the first sub-pixel 10 may have a quadrilateral shape and/or an octagonal shape, and the third sub-pixel 30 may have a triangular shape and/or a quadrilateral shape. Two adjacent third sub-pixels 30, facing each other, may form a third sub-pixel group 31, and the third sub-pixel group 31 may have an overall shape of a quadrilateral shape and/or an octagonal shape. The second sub-pixel 20 may have a quadrilateral shape and/or an octagonal shape. By arranging the shapes of the sub-pixels as described above, the formation of the display units 40 may be more flexible. In practice, the shapes of the sub-pixels can be flexibly determined according to the applications and/or the display effect of the corresponding display panel.

The pixel structures illustrated in FIGS. 3 and 4 are modified from the pixel structure of FIG. 1. In the pixel structures of FIG. 1 and FIGS. 3 and 4, the first sub-pixel 10 may have a rhombic shape, and the third sub-pixel 30 may have an isosceles triangle shape. The third sub-pixel group 31, formed by the two adjacent third sub-pixels 30 facing each other, may have an overall shape of a rhombic shape. The second sub-pixel 20 may have a triangle shape.

The pixel structures of FIGS. 5 and 6 are modified from the pixel structure illustrated in FIG. 1. In the pixel structures of FIGS. 5 and 6, the first sub-pixel 10 may have a rhombic shape, and the third sub-pixel 30 may have a rectangular shape. The third sub-pixel group 31, formed by the two adjacent third sub-pixels 30 facing each other, may have an overall shape of a quadrilateral shape. The second sub-pixel 20 may have a rectangular shape.

In the pixel structure described above, the area of the first sub-pixel 10 may be equal to the area of the third sub-pixel group 31, and the area of the second sub-pixel 20 may be less than the area of the first sub-pixel 10. Alternatively, the area of the third sub-pixel group 31 may be greater than the area of the first sub-pixel 10, and the area of the first sub-pixel 10 may be greater than the area of the second sub-pixel 20.

The color displayed by the first sub-pixels 10, the color display by the second sub-pixels 20, and the color display by the third sub-pixel group 31 may be any one of red (R), blue (B), and green (G) colors such that desirable full-color images can be displayed by the pixel structure. In one embodiment, the first sub-pixels 10 may display red or blue, the second sub-pixels 20 may display green, and the third sub-pixel groups 31 may display blue or red. Particularly, in OLED display devices, since the materials for emitting blue light often has a lower emission efficiency and a shorter lifespan compared to the materials for emitting red light/color and green light, the area of a sub-pixels for displaying blue may be larger than the area of a sub-pixel for displaying red and the area of a sub-pixel for displaying green. In addition, since human eye is more sensitive to green color, and the material for emitting green light may have the highest emission efficiency, a sub-pixel for displaying green may have the smallest area. That is, the area of a second sub-pixel 20 may be smaller than the areas of both a first sub-pixel 10 and a third sub-pixel group 31. Meanwhile, the sub-pixels for displaying green, easier to be identified by human eye, may be distributed uniformly in the directions of row axis and column axis to ensure desirable display quality along the directions of row axis and column axis.

For example, in FIG. 1 and FIGS. 3 to 6, the first sub-pixels may display red (R), the second sub-pixels 20 may display green (G), and the third sub-pixel group 31 may display blue (B). The sub-pixels for displaying red each may be shared by adjacent display units. The sub-pixels for displaying blue may be adjacent and facing each other.

Figure 8:
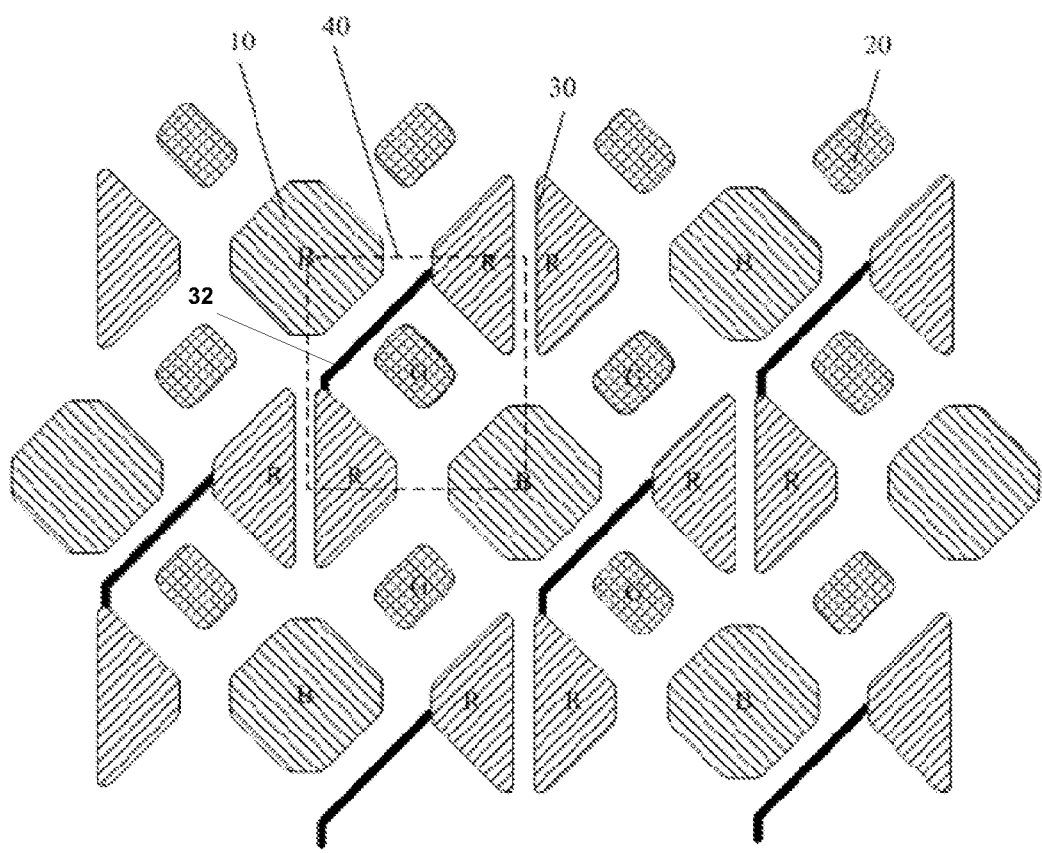
FIG. 8 illustrates schematics of another color configuration of the pixel structure in FIG. 1 of according to the disclosed embodiments.

In FIG. 8, the first sub-pixels 10 may display blue (B), the second sub-pixels 20 may display green (G), and the third sub-pixel groups 31 may display red (R). The sub-pixels for display red may be adjacent and facing each other. The sub-pixels for displaying blue may be shared by adjacent display units 40. In the pixel structures described above, by arranging the sub-pixels for displaying red or blue (i.e., being adjacent or shared), risks of color mixing by sub-pixels can be reduced. Meanwhile, the arrangement described above may also reduce the areas between sub-pixels, i.e., the areas with no light emission, such that the aperture ratio can be increased to about 42%. Using conventional pixel structure designs, the aperture ratios achieved would be lower. For example, using the pixel structure designs shown in FIGS. 16-18, the aperture ratios realized are about 20-30%, 30-35%, and 37%, respectively. The display resolution of the pixel structure can be improved, and desirable aperture ratio can be obtained. The above arrangement can also improve the lifespan and display brightness of the products.

The red (R), green (G), and blue (B) colors described above may each be the color displayed/emitted by one sub-pixel. For example, in the pixel structure of an organic electroluminescent display device, the RGB colors described above may refer to the colors of the light-emitting layer of the organic electroluminescent diodes. When biased normally, the light-emitting layer may emit light with the corresponding color. In the pixel structure of an LCD device, the colors described above may refer to the colors of the CF (Color Filter) layer in the film substrate. When the backlight passes through the CF layer, the backlight is filtered by the CF and light with the corresponding color can be produced.

The pixel structures described above receive pixel display information/data through data lines. In one embodiment, a first sub-pixel 10, a third sub-pixel string 32, and a second sub-pixel 20 each may be connected with a data line for receiving pixel display information/data. Also, the third sub-pixels 30 in one third sub-pixel string 32 may receive the same display information/data. Alternatively, the addressable electrode of each sub-pixel 30 in one third sub-pixel string 32 may be electrically connected.

Figure 16:
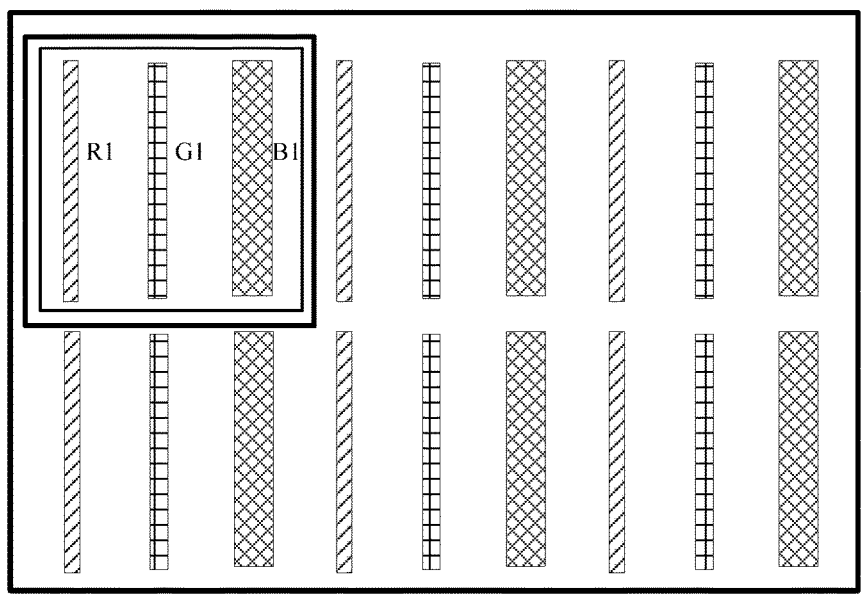
FIGS. 16-18 illustrate schematics of conventional pixel structures.
Figure 17:
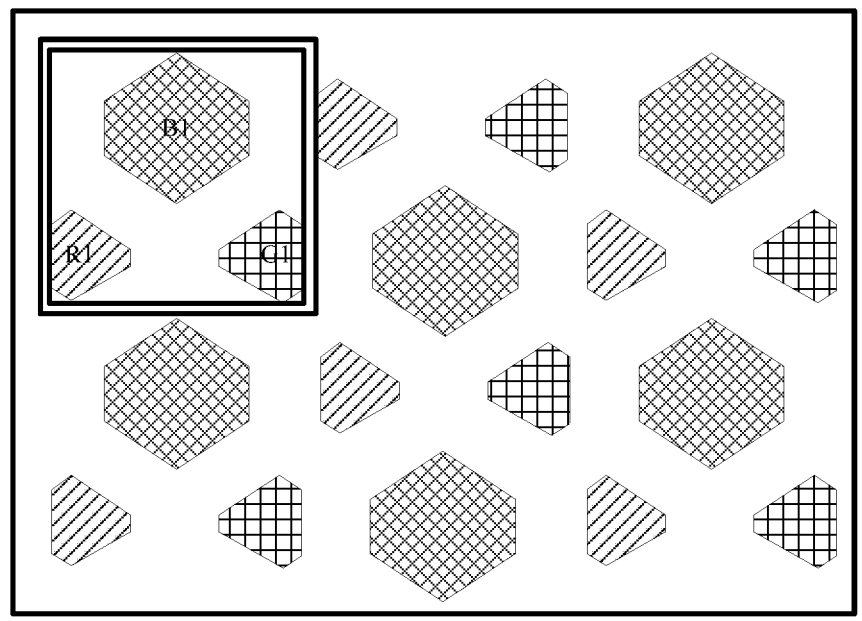
Figure 18:
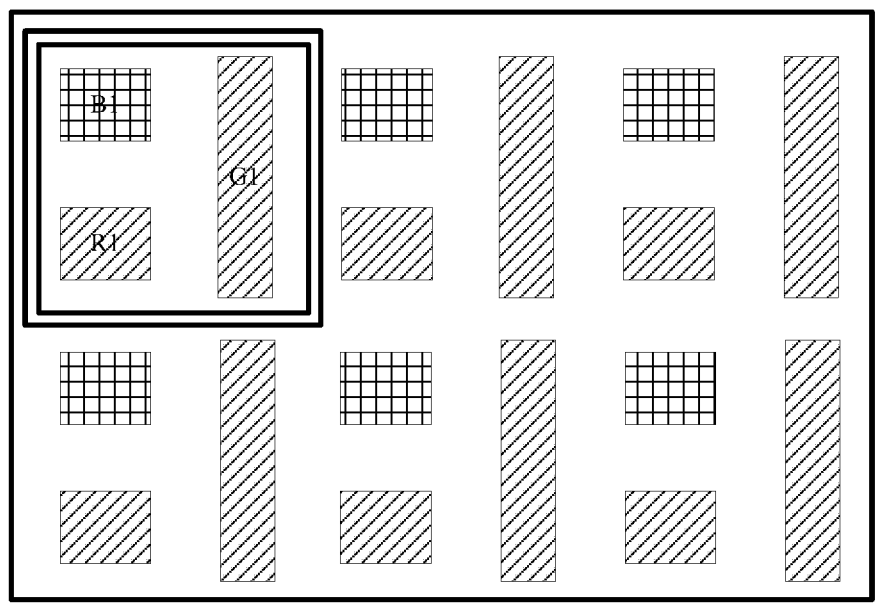

Referring to FIG. 1, since a first sub-pixel 10 may only be connected with one data line and may be shared by the four display units 40 and the third sub-pixel string 32 (the two third sub-pixels 30 connected with a line) may only be connected with one data line and may be shared by three display units 40, the number of data lines used in the disclosed pixel structure can be reduced. The back panel wiring can be easier. Meanwhile, compared to conventional pixel structures (as shown in FIGS. 16 to 18), when the same number of display units 40 are used in the pixel structure, fewer data lines are used in the disclosed pixel structure. Thus, the power consumption of the display apparatus containing the pixel structure can be reduced.

The sub-pixels in the pixel structures presented above may be OLED display devices or LCD display devices. That is, the pixel structure provided by the present disclosure may be suitable for OLED display devices and LCD display devices. It is noted that, the pixel structure disclosed may also be suitable for other devices containing the pixel structures such as digital cameras, plasma display devices, and so on. For example, when the pixel structure is used in an OLED display device, the metal electrodes (i.e., anode or cathode) of each OLED, corresponding to the third sub-pixels 30 in a third sub-pixel string 32, may be electrically connected together. The metal electrodes (i.e., anode or cathode) of each OLED may also not be connected and the same display information can be loaded on each OLED. When the pixel structure is used in an LCD display device, the pixel electrodes of each LCD device, corresponding to the third sub-pixels 30 in a third sub-pixel string 32, may be electrically connected together. The pixel electrode of each LCD device may also not be connected and the same display information can be loaded on each LCD device.

For manufacturing LCD display devices, the first sub-pixels 10, the second sub-pixels 20, and the third sub-pixel groups 31 may be formed through a patterning process. For manufacturing OLED display devices, the first sub-pixels 10, the second sub-pixels 20, and the third sub-pixels 30 may be formed through a deposition process. The patterning process may include a photolithography process, or include a photolithography process and corresponding etching steps. The patterning process may also include printing, inkjet printing, and/or other process for forming predetermined patterns. The photolithography process may refer to the steps including film formation, exposure, and/or development. By applying appropriate photoresist films, masks, and/or exposure apparatus, patterns can be formed through the photolithography process. The deposition process, i.e., the vacuum coating process, may be referred to as the process of evaporating/subliming the material/substance for forming the film and depositing the evaporated/sublimed material/substance on the surface of the substrate/device. To form a certain pattern, the FMM can be applied on the surface of the substrate/device such that the evaporated/sublimed material/substance may not be formed in the areas covered by the FMM. Based on the pixel structure to be formed, appropriate processes can be selected to form the pattern of the pixel structure.

Particularly, for OLED display devices, the first sub-pixels 10, the second sub-pixels 20, and the third sub-pixel groups 31 may correspond to the openings in the FMM. When forming the pixel structures in FIG. 1 and FIGS. 3 to 6, the limit on the distance/spacing between two openings in the FMM may be applied on a diagonal direction (e.g., 45 degrees) to increase the density of the sub-pixels and improve the display resolution. For example, the resolution of greater than 300 ppi (pixels per inch) can be obtained. In comparison, using the conventional pixel structure designs shown in FIGS. 16-18, the resolutions realized are all below 300 ppi.

In the manufacturing process of OLED display devices, since the distance between two sub-pixels may represent the distance in a diagonal direction, the distance/spacing between two sub-pixels may be increased such that it is easier to apply the FMM to form the pattern of sub-pixels. The pattern may correspond to the areas on the FMM with openings to form the sub-pixels. The distance/spacing between the openings (i.e., along a diagonal direction) in the FMM as described above may be much greater than the distance/spacing between the openings (i.e., a long the row axis or column axis) in a conventional FMM. By using the FMM as described above, a pixel structure with higher resolution may be obtained.

Considering the arrangement of the first sub-pixels 10, one first sub-pixel 10 can be shared by four adjacent display units 40. Considering the arrangement of the third sub-pixels 30, when electrically connected, one third sub-pixel 30 can be shared by three display units 40 in one row or in one column. In the pixel structures disclosed above, the distance/spacing between the openings corresponding to adjacent sub-pixels for displaying the same color (i.e., the adjacent sub-pixels for display red, blue, or green) in the FMM may be increased such that the design of the FMM and the deposition process for forming the organic layer can be easier. Higher display resolution may be easier to obtain in the pixel structures provided in the disclosure. Compared to conventional pixel structures (i.e., three sub-pixels forming one display unit 40), the display units 40 of the pixels structures provided in the present disclosure share sub-pixels to display images. The manufacturing process for forming the pixel structures disclosed are greatly simplified, and the design and manufacturing of the FMM is easier.

The present disclosure provides a new pixel structure. By optimizing/improving the arrangement of the sub-pixels for displaying RGB colors, the line representing the shortest distance between the boundaries of two adjacent sub-pixels for displaying different colors may have an angle of 45 degrees with the horizontal direction. Thus, when the manufacturing of the FMM has a certain precision, the arrangement of the sub-pixels described above can obtain higher display resolutions. Meanwhile, the aperture ratio of the sub-pixels can be improved, and the aperture ratio of the display apparatus containing the pixel structure can be improved. Correspondingly, the display brightness of the display apparatus containing the pixel structure can be improved. The lifespan of the OLED display device containing the pixel structure can be improved.

Particularly, the pixel structure provided in the present disclosure is suitable for forming side-by-side top-emitting AMOLED display panels through a deposition process using the FMM.

Another aspect of the present disclosure provides a method for displaying the pixel structure. Embodiment 2 provides the method for displaying the pixel structure in embodiment 1. As described above, in the pixel structure, adjacent display units 40 share one first sub-pixel 10 and one third sub-pixel string 32 for displaying images so that each display unit 40 is able to display pixel display information of three colors (i.e., the RGB colors).

In the pixel structure provided by the present disclosure, the third sub-pixels 30 on one side of the central axis of a first sub-pixel 10 and neighboring the first sub-pixel 10 may form a third sub-pixel string 32. The third sub-pixels 30 in the third sub-pixel string 32 may display the same color. One display unit 40 may include two first sub-pixel 10, a second sub-pixel 20 adjacent to the first sub-pixel 10, and a third sub-pixel string 32 neighboring/between the two first sub-pixel 10. Adjacent display units 40 may share the first sub-pixels 10 and the third sub-pixel string 32 so that each display unit 40 is able to display the pixel display information of three colors (i.e., the RGB colors).

Figure 9:
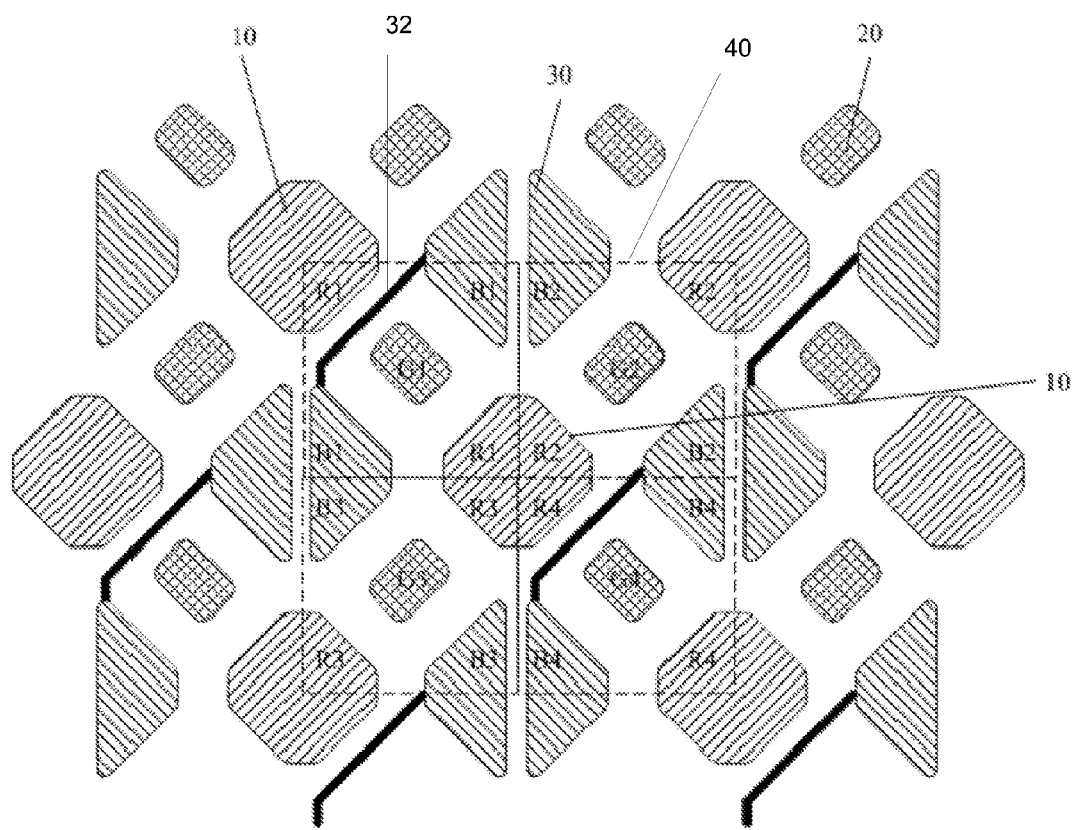
FIG. 9 illustrates an exemplary configuration of display units of the pixel structure in another embodiment according to the disclosed embodiments.

In the pixel structure provided by the present disclosure, as shown in FIG. 9, four adjacent display units 40, positioned in two adjacent columns of two adjacent rows, may form a 2 by 2 block shape. The 2 by 2 block shape may include five first sub-pixels 10. The first sub-pixel 10 positioned at the center of the 2 by 2 block (i.e., four adjacent display units 40) may be adjacent to each of the four second sub-pixels 20 along a diagonal direction. The first sub-pixel 10 positioned at the center may have two perpendicular central axes and the direction of each central axis may extend between two of the four second sub-pixels 20. Of the four second sub-pixels 20, two along one diagonal direction may have mirror symmetry about a central axis of the first sub-pixel 10, and the other two along the other diagonal direction may also have mirror symmetry about a central axis of the first sub-pixel 10. The first sub-pixel 10 positioned at the center may be shared by the four adjacent display units 40. The four adjacent display units 40 may form a large color gamut area. The four first sub-pixels 10 positioned at the four corners of the large color gamut area (i.e., each positioned at one corner) may each be shared by adjacent display units 40 in the adjacent display unit rows.

In the pixel structure illustrated in FIG. 9, the first sub-pixels 10 may display red (R), the second sub-pixels 20 may display (G), and the third sub-pixels 30 may display blue (B). Based on the configuration of the second sub-pixel 20 contained in a display unit 40, display units 40 with different configurations may be defined. The first sub-pixels 10 shared by a plurality of (e.g., four) display units 40 may be labeled as R1, R2, R3, and R4. The third sub-pixel strings 32 shared by a plurality of display units 40 may be labeled as B1, B2, B3, and B4. The sub-pixels with the same labeling number may form a color gamut (e.g., sub-pixels with labels of R1, G1, and B1 may form a gamut, and sub-pixels with labels of R2, G2, and B2 may form another color gamut). In one color gamut, the colors formed by mixing the colors displayed by the sub-pixels may represent the pixel display information of the color gamut.

When display images, first, a data source for providing the pixel display information may be used to input/send corresponding pixel display information (i.e., containing the RGB color information for the first sub-pixel 10, the second sub-pixel 20, and the third sub-pixel string 32), to each pixel unit 40. The method for displaying the pixel structure may include the following steps.

In step S1, the theoretical brightness values for each pixel unit may be obtained based on the pixel display information. The theoretical brightness values may correspond to the colors displayed by the first sub-pixel 10, the second sub-pixel 20, and the third sub-pixel string 32.

In step S1, the driving circuit/chip of the display panel may determine, receive, and store the pixel display information, and amplify the pixel display information for each color to obtain display information for the three primary colors (i.e., RGB colors). The driving circuit may further obtain brightness signals through suitable matrix transformation processes. The brightness signals may correspond to the theoretical brightness values of the three primary colors. The process described above can be obtained by using any suitable brightness/color separation means used in conventional manufacturing processes and is omitted herein.

In step S2, the actual brightness values of the first sub-pixel 10, the second sub-pixel 20, and the third sub-pixel string 32 of each pixel unit may be calculated.

In step S2, the actual brightness value of a first sub-pixel 10 may be calculated as a sum, i.e., a weighted sum, of the weighted theoretical brightness value of each shared portion of the first sub-pixel 10. The actual brightness value of a second sub-pixel 20 may be the theoretical brightness value corresponding to the color displayed by the second sub-pixel 20. The actual brightness value of the third sub-pixel string 32 may be calculated as a sum of the weighted theoretical brightness values of each shared portion of the third sub-pixel string 32. A shared portion of a first sub-pixel 10 or a third sub-pixel string 32 may refer to a portion shared by an adjacent display unit 40.

In the pixel structure illustrated in FIG. 9, since four adjacent display units 40 (i.e., depicted as the 2 by 2 block) may share one first sub-pixel 10 (e.g., the first sub-pixel 10 positioned at the center of the 2 by 2 block), the weight (or relative weight) for the theoretical brightness value of each shared portion of the first sub-pixel 10 may be ¼. For example, the first sub-pixels 10 may display red, the input signal sent to a first sub-pixel 10 may be a sum of the weighted pixel display information for the red color displayed by each shared portion of the first sub-pixel 10. Each shared portion is shared by one of the four adjacent display units 40. The weight may each be ¼.

A third sub-pixel string 32 may include two adjacent third sub-pixels 30 along a diagonal direction. Each third sub-pixel 30 is contained in a different third sub-pixel group 31. A second sub-pixel 20, a third sub-pixel string 32 with the shortest distance to the second sub-pixel 20, and two first sub-pixels 10 positioned on two sides of the second sub-pixel 20 in two adjacent rows and each having the shortest distance to the second sub-pixel 20 along a diagonal direction, may form a display unit 40. In one display unit 40, the third sub-pixel string 32, positioned next to the second sub-pixel 20, may be shared by an adjacent display unit 40 in an upper and/or a lower adjacent display unit row. Alternatively, the third sub-pixel string 32 of one display unit 40, positioned next to the second sub-pixel 20, may be shared by an adjacent display unit 40 in an upper/right and/or a lower/left adjacent display unit column. The weight for the theoretical brightness value of each shared portion of a third sub-pixel 30 in the third sub-pixel string 32, shared by adjacent display units 40, may each be ½. For example, the third sub-pixel strings 32 may display blue, and the input signal sent to the third sub-pixel string 32 may be a sum of the weighted pixel display information for the blue color of each shared portion of the third sub-pixel string 32, and the weight may each be ½.

In one embodiment, the final brightness value of a first sub-pixel 10 (or a third sub-pixel string 31) may be calculated as a sum of weighted theoretical brightness values for the color displayed by each shared portion of the first sub-pixels 10 (or the third sub-pixel string 31). The weighted theoretical brightness value is a product of the theoretical brightness value of the color displayed by a shared portion and the corresponding weight. For example, when a first sub-pixel 10 is shared by four display units 40, the relationship between the sum and weighted theoretical brightness values described above can be, H=Ax+By+Cz+Dδ, where A, B, C, and D may each represent a weight for the display information of the color displayed by a shared portion of the sub-pixel and H may represent the actual brightness value of the color displayed by the sub-pixel (i.e., the weighted sum). The values of the weights may satisfy A+B+C+D=1.

It should be understood that, since the overall display effect (e.g., bright or dark) of the image displayed may be dependent on the pixel display information, the weights for theoretical brightness values of the color displayed by the first sub-pixel 10 (or the third sub-pixel string 32) can be adjusted to obtain a more appropriate weighted sum and improved display brightness.

In step S3, the actual brightness value may be sent/inputted to the first sub-pixel 10, the second sub-pixel 20, and the third sub-pixel string 32 of each pixel unit to display images.

In step S3, the actual brightness values of the first sub-pixel 10, the second sub-pixel 20, and the third sub-pixel string 32 of each display unit may be obtained through step S2. The actual brightness values may be sent to the corresponding sub-pixels to display images.

As shown in the pixel structures described above (e.g., in embodiment 1), a first sub-pixel 10, a second sub-pixel 20, and a third sub-pixel string 32 may each be connected with a data line. In step 3, the first sub-pixel 10, the second sub-pixel 20, and the third sub-pixel string 32 may receive the corresponding actual brightness value (i.e., obtained from step S2) through the data line.

For illustration purposes, the method for displaying the pixel structure is applied on the pixel structure illustrated in FIG. 1 (in embodiment 1). The color mixing of a display unit, the formation of a color gamut, and the calculation of actual brightness values are illustrated for the pixel structure of FIG. 9. As shown in FIG. 9, the sub-pixels for displaying red may be the first sub-pixels 10, the sub-pixels for displaying blue may be the third sub-pixels 30, and two third sub-pixels 30 may form a third sub-pixel strings 32. Similarly, the actual brightness values of the sub-pixels in the pixel structures of FIGS. 3 to 6 (modified from the pixel structure of FIG. 1) may be calculated in the same manner. Meanwhile, in the pixel structure of FIG. 8 in embodiment 1, the sub-pixels for displaying blue may be the first sub-pixels 10, the sub-pixels for displaying red may be the third sub-pixels 30, and two adjacent third sub-pixels 30 may form a third sub-pixel strings 32. The actual brightness values of the sub-pixels in the pixel structure of FIG. 8 may be calculated in the same manner and the details are omitted herein.

By applying the method provided in the present disclosure, brightness information of the sub-pixels can be calculated through suitable pixel sharing algorithms and desirable display effect can obtained for the pixel structure. The number of data lines used in the pixel structure can be reduced, and back panel wiring can be made easier. The power consumption of the display apparatus containing the pixel structure can be further reduced.

The present disclosure further provides another pixel structure. Compared to the pixel structures disclosed in previous embodiments of the present disclosure, such as the pixel structures in FIG. 1 and FIGS. 3 to 9, the pixel structure may include a greater number of third sub-pixels 30 in one third sub-pixel string 32 for displaying the same color.

Another aspect of the present disclosure provides another pixel structure. Embodiment 3 provides the pixel structure. Compared to the pixel structure described in embodiment 1, the third sub-pixel strings 32 in the pixel structure provided in embodiment 3 may include more third sub-pixels 30. The third sub-pixels 30 display the same color.

Similar to the pixel structure provided in embodiment 1, the pixel structure provided in embodiment 3 may also be used in OLED display devices and/or LCD devices. The pixel structure may also be used in other suitable device with display functions such as digital cameras, and plasma display devices.

Figure 10:
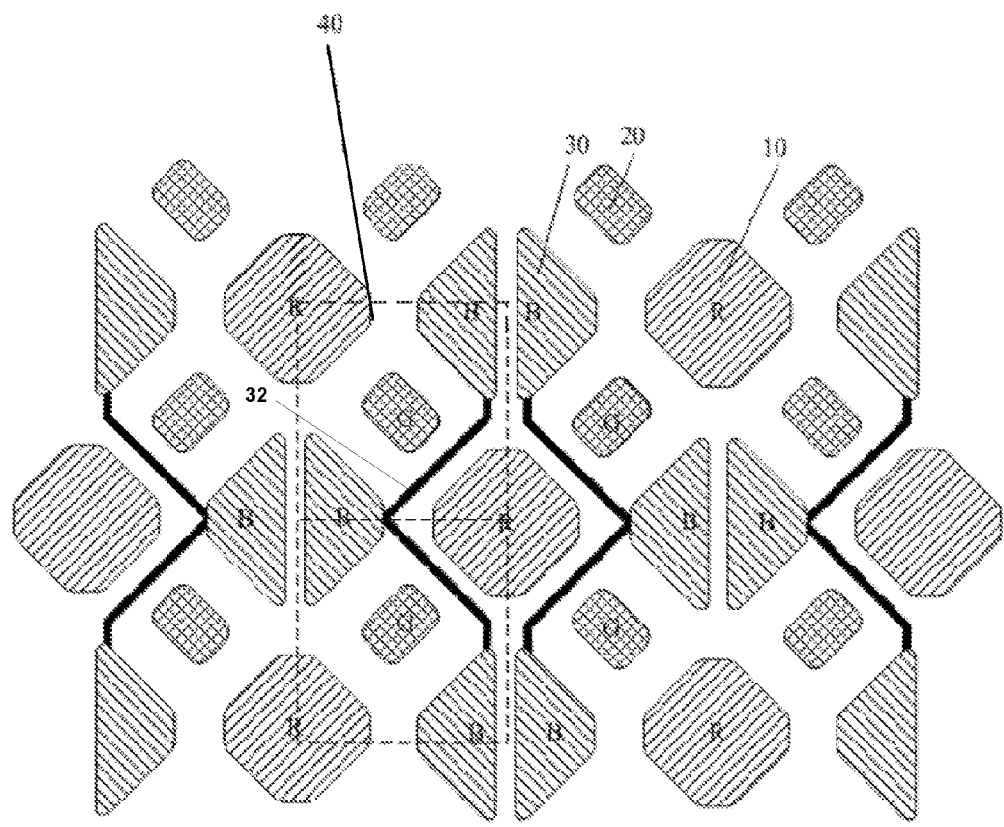
FIG. 10 illustrates schematics of an arrangement of the pixel structure of another embodiment according to the disclosed embodiments.

In one embodiment, as shown in FIG. 10, a third sub-pixel string 32 may include three sub-pixels 30 neighboring a first sub-pixel 10. The three third sub-pixels 30 may be positioned on the same side of the central axis of a first sub-pixel 10. Each of the three third sub-pixels 30 may be contained in a different third sub-pixel group 31. One of the third sub-pixels 30 may be positioned at the crossing of the two diagonal directions adjacent to the first sub-pixel 10, the second third sub-pixel 30 may be aligned with the sub-pixel 30 at the crossing along one diagonal direction, and the third sub-pixel 30 may be aligned with the sub-pixel 30 at the crossing along the other diagonal direction. Three consecutive second sub-pixel 20 in a column, three first sub-pixels 10 each positioned in a row between two adjacent second sub-pixels 20 and each having a shortest distance to the adjacent second sub-pixels 20 along a diagonal direction, and a third sub-pixel string 32 with a shortest distance to the second sub-pixels 20 may form a display unit 40.

Specifically, the three third sub-pixels 30 in the third sub-pixel group 32 next to the first sub-pixel 10, aligned along the two diagonal directions, may include a third sub-pixel 30 adjacent to and in the same row as the first sub-pixel 10, and two adjacent third sub-pixels 30 adjacent to and in the same column on both (i.e., upper and lower) sides of the first sub-pixel 10. The three third sub-pixels 30 described above may each be contained in a different third sub-pixel group 31. For example, the first sub-pixel 10 described above may be the first sub-pixel 10 marked in M in the middle row as shown in (A) and (B) of FIG. 14.

The three third sub-pixels 30 in the third sub-pixel string 32 in the display unit 40 illustrated in FIG. 10 may also be described as follows. The third sub-pixel string 32 may include the third sub-pixel 30 adjacent to and in the same row with the first sub-pixel 10, which is between the two first sub-pixels 10 on two sides of the display unit 40, and the two third sub-pixels 30 adjacent to and on both sides of the first sub-pixel 10, which is between the two first sub-pixels 10 on two sides of the display unit 40. The two third sub-pixels 30 may be contained in a different third sub-pixel group 31.

Figure 14:
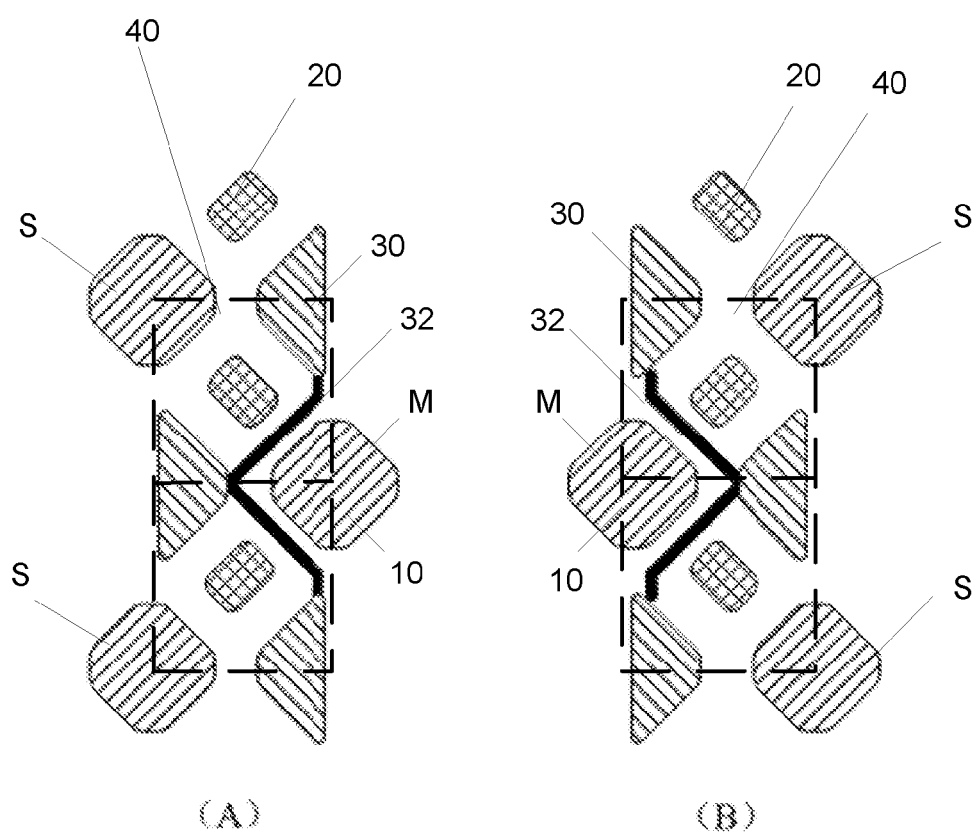
FIG. 14 illustrates schematics of different configurations of display units in the pixel structure of FIG. 10 according to the disclosed embodiments.

That is, the third sub-pixel string 32 neighboring the first sub-pixels 10 (labeled with S in (A) and (B) of FIG. 14) on one side of a display unit 40 may represent the same third sub-pixel string 32 neighboring the other first sub-pixel 10 (labeled with M) in the same display unit 40. In other words, the three first sub-pixels 10 and three second sub-pixels 20 in one display unit 40 may share the same neighboring third sub-pixel string 32, as shown in (A) and (B) of FIG. 14.

Figure 11:
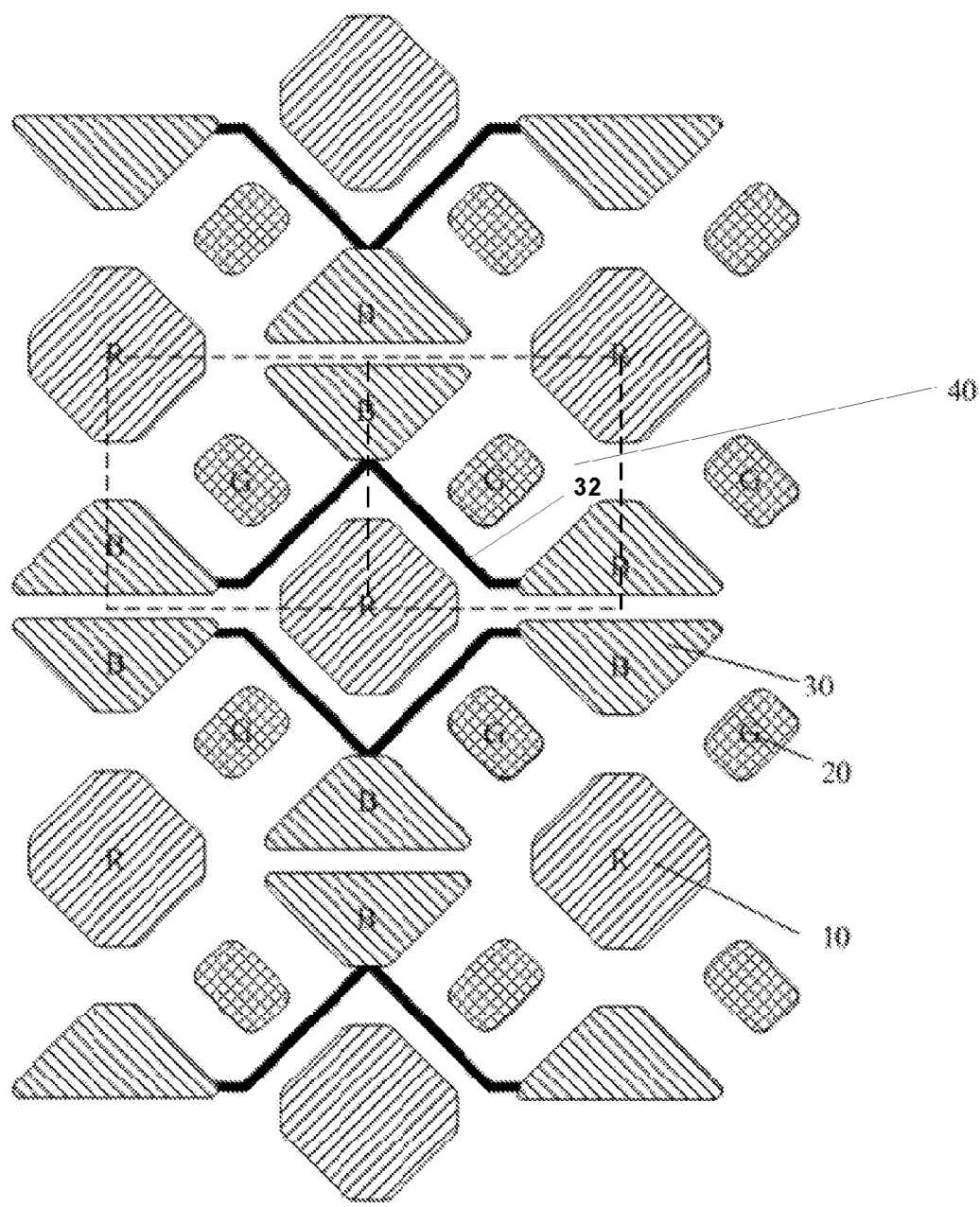
FIG. 11 illustrates schematics of the pixel structure of FIG. 10 with a rotation angle of 90 degrees according to the disclosed embodiments.

The pixel structure of FIG. 11 can be obtained by rotating the pixel structure of FIG. 10 for 90 degrees. In FIG. 11, a third sub-pixel string 32 may include three sub-pixels 30 neighboring a first sub-pixel 10. The three third sub-pixels 30 may be positioned on the same side of the central axis of a first sub-pixel 10. Each of the three third sub-pixels 30 may be contained in a different third sub-pixel group 31. One of the third sub-pixels 30 may be positioned at the crossing of the two diagonal directions adjacent to the first sub-pixel 10, the second third sub-pixel 30 may be aligned with the sub-pixel 30 at the crossing along one diagonal direction, and the third sub-pixel 30 may be aligned with the sub-pixel 30 at the crossing along the other diagonal direction. Three consecutive second sub-pixel 20 in a row, three first sub-pixels 10 each positioned in a column between two adjacent second sub-pixels 20 and each having a shortest distance to the adjacent second sub-pixels 20 along a diagonal direction, and a third sub-pixel string 32 with a shortest distance to the second sub-pixels 20 may form a display unit 40.

The three third sub-pixels 30 in the third sub-pixel group 32, aligned along the two diagonal directions and next to the first sub-pixel 10, may include a third sub-pixel 30 adjacent to and in the same row with the first sub-pixel 10, and two third sub-pixels 30 adjacent to and in the same row on both (i.e., upper and lower) sides of the first sub-pixel 10. The three third sub-pixels 30 described above may each be contained in a different third sub-pixel group 31.

The three third sub-pixels 30 in the third sub-pixel string 32 in the display unit 40 illustrated in FIG. 11 may also be described as follows. The third sub-pixel string 32 may include the third sub-pixel 30 adjacent to and in the same column with the first sub-pixel 10, which is between the two first sub-pixels 10 on two sides of the display unit 40, and the two third sub-pixels 30 adjacent to and on both sides of the first sub-pixel 10, which is between the two first sub-pixels 10 on two sides of the display unit 40. The two third sub-pixels 30 may each be contained in a different third sub-pixel group 31.

Figure 12:
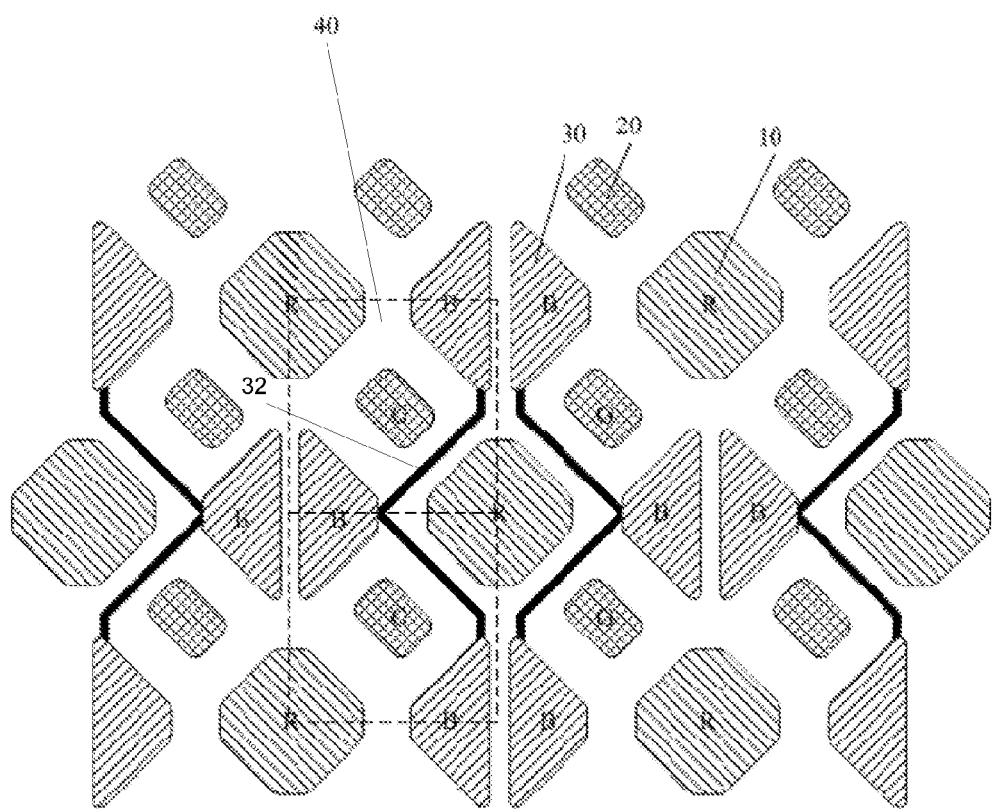
FIG. 12 illustrates schematics of another arrangement of the second sub-pixel in the pixel structure of FIG. 10 according to the disclosed embodiments.
Figure 13:
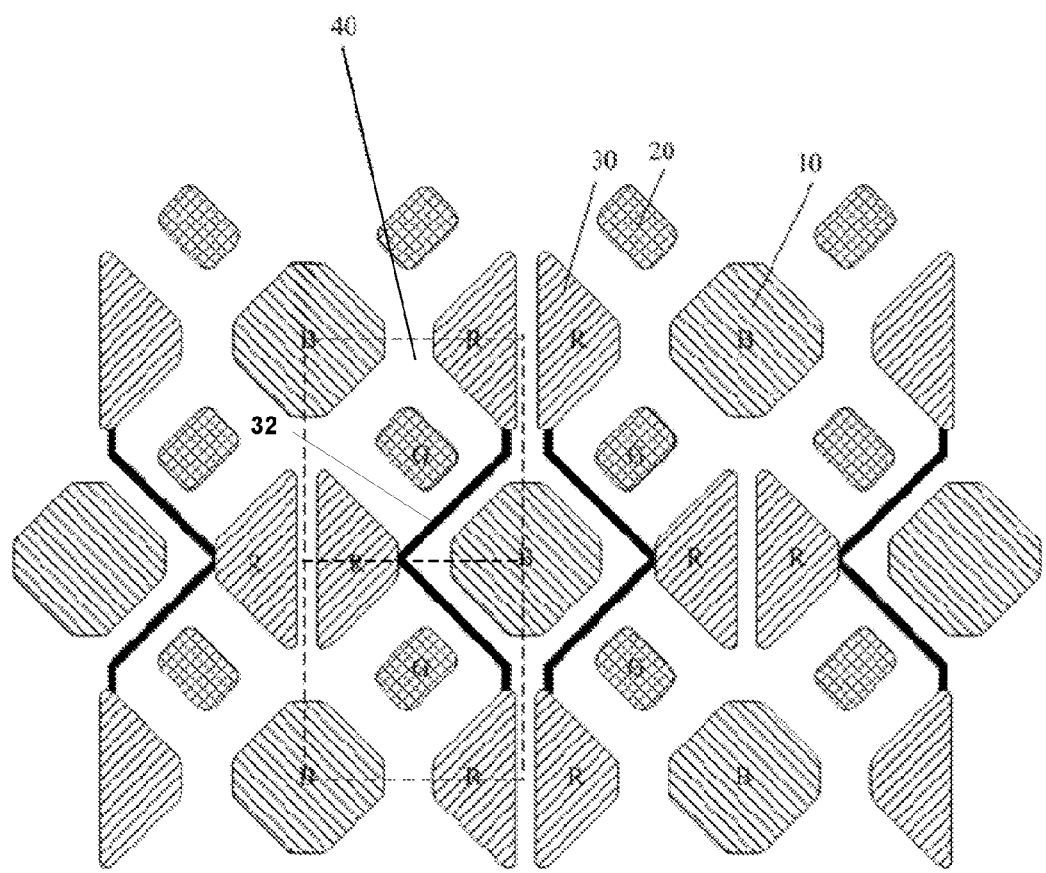
FIG. 13 illustrates schematics of another arrangement of the sub-pixels in the pixel structure of FIG. 10.

Similar to embodiment 1, the configuration/arrangement of the second sub-pixels 20 in the pixel structure of FIG. 11 can also be modified to form the pixel structure shown in FIG. 12. Alternatively, the arrangement of colors displayed by the first sub-pixels 10 and the third sub-pixels 30 in the pixel structure of FIG. 11 can be modified to form the pixel structure shown in FIG. 13.

The pixel structures of FIGS. 10 to 13 can be divided into different display units 40 with different configurations. Each display unit 40 may share sub-pixels with adjacent display units 40. FIG. 14 illustrates two display units 40 (separated by the dashed line in between) with different configurations. In (A) and (B) of FIG. 14, three third sub-pixels 30 connected by lines may form a third sub-pixel string 32. Each third sub-pixel string 32 may be formed by third sub-pixels 30 with direct connection. The third sub-pixel string 32 may be shared by two other display units 40, and each of the two other display units 40 may include one of the two second sub-pixels 20, adjacent to the lines of direct connection, in the display unit 40. The two second sub-pixel 20, each adjacent to the first sub-pixel 10 in the middle (labeled with M) along a diagonal direction, may each have centrosymmetry about the geometric center of the first sub-pixel 10 (labeled with M) with another second sub-pixel 20 (not shown). That is, the two other display units 40, each containing one of the two second sub-pixels 20 in the pixel unit 40 shown in FIG. 14, may share the first sub-pixel 10 (labeled with M). Also, the two second sub-pixels 20, each adjacent to the same third sub-pixel string 32 and adjacent to the lines of direct connection in the display unit 40, may be positioned in the same column/row. The two display units 40, each containing one of the three second sub-pixels 20, may share the third sub-pixel string 32.

As shown in FIGS. 10 to 13, when the pixel structure is used in an OLED display device, the metal electrodes (i.e., anode or cathode) of the OLEDs, corresponding to the third sub-pixels 30 in a third sub-pixel string 32, may be electrically connected together. The metal electrodes (i.e., anode or cathode) of the OLEDs may also not be connected and the same display information can be loaded on each OLED. When the pixel structure is used in an LCD display device, the pixel electrodes corresponding to the third sub-pixels 30 in a third sub-pixel string 32 may be electrically connected together. The pixel electrodes may also not be connected and the same display information can be loaded on each pixel electrode.

Compared to the pixel structure disclosed in embodiment 1, the pixel structure disclosed in embodiment 3 may further reduce the number of data lines used in the pixel structure. Back panel wiring can be made easier, and the power consumption of the display apparatus containing the pixel structure can be further reduced.

Another aspect of the present disclosure provides a method for displaying the pixel structure in embodiment 3. In the pixel structure described in embodiment 3, adjacent display units 40 may share a first sub-pixel 10 and a third sub-pixel string 32 for displaying images such that each display unit 40 is able to display pixel display information of three primary colors (i.e., RGB colors). Embodiment 4 illustrates the method for displaying the pixel structure in embodiment 3.

The method for displaying the pixel structure disclosed in embodiment 3 can be referred to the method for displaying the pixel structure disclosed in embodiment 1. Since the number of third sub-pixels 30 in one third sub-pixel string 32 may be different from the pixel structure disclosed in embodiment 3, the weights for calculating the actual brightness values of the third sub-pixel strings 32 can be adjusted.

Figure 15:
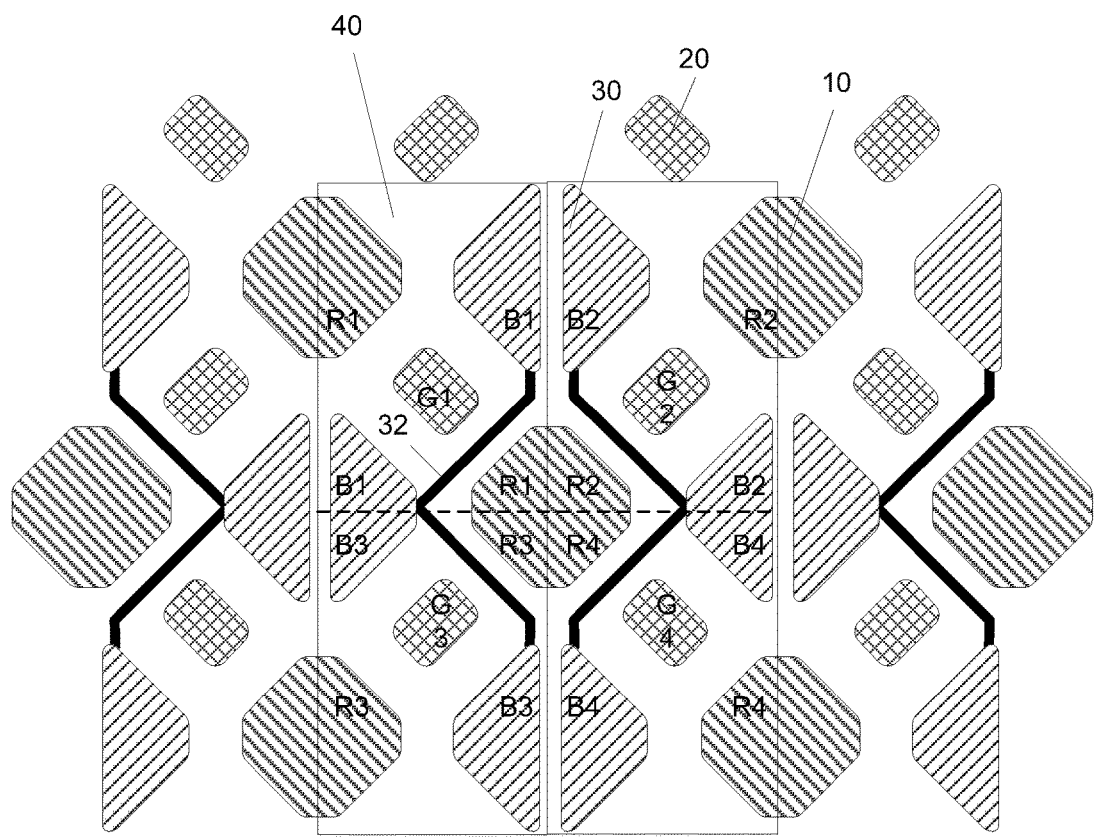
FIG. 15 illustrates schematics of an exemplary configuration of display units of the pixel structure in another embodiment according to the disclosed embodiments.

In one embodiment, as shown in FIG. 15, a third sub-pixel string 32 may include three sub-pixels 30 next to a first sub-pixel 10. The three third sub-pixels 30 may be positioned on the same side of the central axis of a first sub-pixel 10. Each of the three third sub-pixels 30 may be contained in a different third sub-pixel group 31. One of the third sub-pixels 30 may be positioned at the crossing of the two diagonal directions adjacent to the first sub-pixel 10, the second third sub-pixel 30 may be aligned with the sub-pixel 30 at the crossing along one diagonal direction, and the third third sub-pixel 30 may be aligned with the sub-pixel 30 at the crossing along the other diagonal direction. Three consecutive second sub-pixels 20 in a column, three first sub-pixels 10 each positioned in a row between two adjacent second sub-pixels 20 and each having a shortest distance to the adjacent second sub-pixels 20 along a diagonal direction, and a third sub-pixel string 32 with a shortest distance to the second sub-pixels 20 may form a display unit 40.

The first sub-pixels 10 may display red (R), the second sub-pixels 20 may display green (G), and the third sub-pixels 30 may display blue (B). Based on the configuration of the second sub-pixel 20 contained, different display units 40 can be defined. The first sub-pixel 10, which may be shared by a plurality of display units 40, may be labeled with R1, R2, R3, and R4. The third sub-pixel string 32, which may be shared by a plurality of display units 40, may be labeled with B1, B2, B3, and B4. The sub-pixels with the same labeling number may form one color gamut (e.g., R1, G1, and B1 may form one gamut, and R2, G2, and B2 may form another color gamut). The color formed by mixing the colors of the sub-pixels in a gamut may represent the display information of the color gamut.

The method for displaying the pixel structure of FIG. 15 may include the following steps.

In step S1, the theoretical brightness values from the pixel display information for each display unit 40 may be obtained, where the theoretical brightness values may correspond to the colors displayed by the first sub-pixel 10, the second sub-pixel 20, and the third sub-pixel string 32 of each display unit 40.

In step S2, the actual brightness values of the first sub-pixel 10, the second sub-pixel 20, and the third sub-pixel string 32 of each display unit 40 can be calculated.

In step S2, a third sub-pixel string 32 may include three sub-pixels 30 neighboring a first sub-pixel 10. The three third sub-pixels 30 may be positioned on the same side of the central axis of a first sub-pixel 10. Each of the three third sub-pixels 30 may be contained in a different third sub-pixel group 31. One of the third sub-pixels 30 may be positioned at the crossing of the two diagonal directions adjacent to the first sub-pixel 10, the second third sub-pixel 30 may be aligned with the sub-pixel 30 at the crossing along one diagonal direction, and the third sub-pixel 30 may be aligned with the sub-pixel 30 at the crossing along the other diagonal direction. Three consecutive second sub-pixels 20 in a column, three first sub-pixels 10 each positioned in a row between two adjacent second sub-pixels 20 and each having a shortest distance to the adjacent second sub-pixels 20 along a diagonal direction, and a third sub-pixel string 32 with a shortest distance to the second sub-pixels 20 may form a display unit 40. The two consecutive second sub-pixels 20 may be aligned in one row/column and positioned adjacent to the third sub-pixel string 32. Two display units 40, each containing one of the two second sub-pixels 20, may share the same third sub-pixel string 32. The weights of the theoretical brightness values for the color displayed by the shared portion of the third sub-pixel string 32 in each of the three display units 40 may be ⅓.

In step S3, the corresponding actual brightness values may be inputted into the first sub-pixel 10, the second sub-pixel 20, and the third sub-pixel string 32 of each pixel unit to display images.

By applying the method provided in the present disclosure, brightness information of the sub-pixels can be calculated through suitable pixel sharing algorithms and the pixel structure can obtain desirable display effect. The number of data lines used in the pixel structure can be reduced, and back panel wiring can be easier. The power consumption of the display apparatus containing the pixel structure can be further reduced.

Another aspect of the present disclosure provides a display apparatus. The display apparatus may include the pixel structures disclosed in embodiment 1 or embodiment 3. The pixel structure in the display apparatus can be operated by the corresponding method provided in the disclosed embodiments.

The display apparatus can be an LCD panel, an electronic paper, an OLED panel, a mobile phone, a tablet, a television, a monitor, a laptop, a digital photo frame, a navigator device, and/or any suitable product/device with display functions.

In the display apparatus, since the pixel structure is formed by an improved deposition process, the aperture ratio of the sub-pixels are improved. The pixel structure thus has improved display brightness. Meanwhile, since the sub-pixels in the pixel structure have improved display brightness and color uniformity, the display apparatus containing the pixel structure can thus have improved display effect.

The pixel structures and corresponding methods provided in the present disclosure improve the aperture ratio of the sub-pixels, and improve the display brightness and display resolution of the pixel structure. The display effect of the display apparatus containing the pixel structure can be improved. Meanwhile, by using the method for displaying the pixel structure, images can be displayed normally and back panel wiring of the data lines can be easier. The power consumption of the display apparatus can be reduced. The present disclosure provides a technical solution to the problems existing in conventional display apparatus such as difficulty in improving the display resolution in OLED display apparatuses due to limitations in manufacturing process.

It should be noted that the embodiments are only exemplary. The arrangement/configuration of the sub-pixels may be subjected to different designs or applications and should not be limited by the exemplary embodiments.

It should be noted that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A pixel structure, comprising first sub-pixels, second sub-pixels, and third sub-pixels, wherein:
   two adjacent third sub-pixels facing each other form a third sub-pixel group;
   the second sub-pixels are arranged in a row along a direction of a first axis to form second-sub-pixel rows, the first sub-pixels and the third sub-pixel groups are arranged in an alternating configuration along the direction of the first axis parallel to the second-sub-pixel rows, and the second-sub-pixel rows and rows formed by the first sub-pixels and the third sub-pixel groups are arranged in an alternating configuration;
   the second sub-pixels are arranged along a direction of a second axis to form second-sub-pixel columns, the first sub-pixels and the third sub-pixel groups are arranged in an alternating configuration along the direction of the second axis parallel to the second-sub-pixel columns, the second-sub-pixel columns and columns formed by the first sub-pixels and the third sub-pixel groups are arranged in an alternating configuration;
   geometric center of each second sub-pixel is positioned on a perpendicular bisector of a line connecting centers of any two of adjacent third sub-pixel groups and first sub-pixels;
   at least two of the third sub-pixels neighboring the first sub-pixel and positioned on a same side of a central axis of the first sub-pixel are connected with direct connection lines to form a third sub-pixel string, the third sub-pixel string displaying a same color;
   the first axis is different from the second axis;
   geometric centers of the first sub-pixels in consecutive rows and consecutive columns are aligned to form lines along one of diagonal directions;
   geometric centers of the third sub-pixel groups in consecutive rows and consecutive columns are aligned to form lines along a diagonal direction parallel to lines formed by the geometric centers of the first sub-pixels such that the lines formed by the geometric centers of the first sub-pixels and lines formed by the geometric centers of third sub-pixel groups are arranged in an alternating configuration;
   each second sub-pixel is aligned between two adjacent first sub-pixels and two adjacent third sub-pixel groups, the two adjacent first sub-pixels being aligned in one diagonal direction and the two adjacent third sub-pixel groups being aligned in another diagonal direction; and a geometric center of each second sub-pixel is arranged at an intersection of a perpendicular bisector of a line connecting geometric centers of adjacent first sub-pixel and third sub-pixel group in an adjacent row and a perpendicular bisector of a line connecting geometric centers of adjacent first sub-pixel and third sub-pixel group in an adjacent column;

a diagonal direction is 45 degrees clockwise with the direction of the first axis, 45 degrees counter clockwise with the direction of the first axis, 45 degrees clockwise with the direction of the second axis, or 45 degrees counter clockwise with the direction of the second axis.

2. The pixel structure according to claim 1, wherein:
geometric centers of the first sub-pixels positioned in one row or one column are aligned along a straight line;
geometric centers of the third sub-pixel groups positioned in one row or one column are aligned along a straight line; and
geometric centers of the second sub-pixels positioned in one row or one column are aligned along a straight line.

3. The pixel structure according to claim 2, wherein:
a display unit includes the first sub-pixel, the second sub-pixel adjacent to the first sub-pixel, and the third sub-pixel string neighboring the first sub-pixel, adjacent display units sharing the first sub-pixel and the third sub-pixel string.

4. The pixel structure according to claim 3, wherein:
the third sub-pixel string includes two neighboring third sub-pixels along a diagonal directions, each of the two neighboring third sub-pixels being contained in a different third sub-pixel group along the diagonal direction and the two neighboring third sub-pixels being positioned on two sides of the second sub-pixel in two adjacent rows and each having a shortest distance to the second sub-pixel along the diagonal direction; and
the second sub-pixel, a third sub-pixel string having a shortest distance to the second sub-pixel, and two first sub-pixels positioned on two sides of the second sub-pixel in two adjacent rows and each having a shortest distance along a diagonal direction to the second sub-pixel form a display unit.

5. The pixel structure according to claim 3, wherein:
the third sub-pixel string includes two neighboring third sub-pixels along a diagonal directions, the two neighboring third sub-pixels each being contained in a different third sub-pixel group along the diagonal direction and the two neighboring third sub-pixels are positioned on two sides of the second sub-pixel in two adjacent columns, and each of the two neighboring third sub-pixels having a shortest distance to the second sub-pixel along the diagonal direction; and
the second sub-pixel, a third sub-pixel string having a shortest distance to the second sub-pixel, and two first sub-pixels positioned on two sides of the second sub-pixel in two adjacent columns and each having a shortest distance along a diagonal direction to the second sub-pixel form a display unit.

6. The pixel structure according to claim 4, wherein:
two adjacent second sub-pixels positioned on two sides of the first sub-pixel and aligned along a diagonal direction have centrosymmetry about the geometric center of the first sub-pixel, two other adjacent second sub-pixels positioned on two sides of the first sub-pixel and aligned along another diagonal direction have centrosymmetry about the geometric center of the first sub-pixel, and four display units each includes one of the adjacent second sub-pixels share the first sub-pixel; and in the display unit, the third sub-pixel string neighboring the second sub-pixel is shared by an adjacent display unit in an upper adjacent row, an adjacent display unit in a lower adjacent row, or a combination of the upper adjacent row and the lower adjacent row.

7. The pixel structure according to claim 4, wherein:
in the display unit, the third sub-pixel string neighboring the second sub-pixel is shared by an adjacent display unit in an upper adjacent column, an adjacent display unit in a lower adjacent column, or a combination of the upper adjacent column and the lower adjacent column.

8. The pixel structure according to claim 3, wherein:
three third sub-pixels in the third sub-pixel string are positioned on a same side of a central axis of the first sub-pixel, and each of the three third sub-pixels is contained in a different third sub-pixel group;
two of the third sub-pixels are aligned along one diagonal direction, two of the third sub-pixels are aligned along the other diagonal direction, one third sub-pixel being positioned on a crossing of two diagonal directions; and
the second sub-pixel, two adjacent first sub-pixels positioned on two sides of the second sub-pixel in two adjacent rows and having the shortest distance to the second sub-pixel along a diagonal direction, and a third sub-pixel string with a shortest distance to the second sub-pixel forms a display unit.

9. The pixel structure according to claim 8, wherein the third sub-pixel string neighboring the first sub-pixel includes:
an adjacent third sub-pixel in a same row as the first sub-pixel, and two adjacent third sub-pixels in a same column on upper and lower sides of the first sub-pixel, where each of three neighboring third sub-pixels is contained in a different third sub-pixel group;
or
a third sub-pixel positioned adjacent to and in a same row with a first sub-pixel positioned on one side of the display unit, two third sub-pixels each being positioned adjacent to another first sub-pixel in a same display unit, the two third sub-pixels being positioned in two adjacent rows and each being contained in a different third sub-pixel group.

10. The pixel structure according to claim 8, wherein the third sub-pixel string neighboring the first sub-pixel includes:
an adjacent third sub-pixel in a same column as the first sub-pixel, and two adjacent third sub-pixels in a same row on upper and lower sides of the first sub-pixel, where each of three neighboring third sub-pixels is in a different third sub-pixel group;
or
a third sub-pixel positioned adjacent to and in a same column with a first sub-pixel positioned on one side of the display unit, and two third sub-pixels each being positioned adjacent to another first sub-pixel in a same display unit, the two third sub-pixels being positioned in two adjacent columns and each being contained in a different third sub-pixel group.

11. The pixel structure according to claim 8, wherein:
two second sub-pixels adjacent to the first sub-pixel aligned along a diagonal direction have centrosymmetry about a geometric center of the first sub-pixel;
another two second sub-pixels adjacent to the first sub-pixel aligned along another other diagonal direction have centrosymmetry about the geometric center of the first sub-pixel;

four display units each containing one of the second sub-pixels share the first sub-pixel; and two display units each containing one of two second sub-pixels share the third sub-pixel string, the two second sub-pixels being aligned in a row adjacent to the third sub-pixel string or a column adjacent to the third sub-pixel string.

12. The pixel structure according to claim 1, wherein:

two third sub-pixels of a same third sub-pixel group have mirror symmetry along the row axis or along the column axis and are positioned between two first sub-pixels; and two third sub-pixels positioned on two sides of a same first sub-pixel and in a same row or in a same column as the first sub-pixel have centrosymmetry or mirror symmetry about a geometric center of the first sub-pixel, the two third sub-pixels each having a shortest distance to the first sub-pixel along the direction of the first axis or the second axis.

13. The pixel structure according to claim 1, wherein:

two third sub-pixels of a same third sub-pixel group are positioned between adjacent two second sub-pixels along a diagonal direction and a line connecting geometric centers of the two third sub-pixels lies between the two third sub-pixels; and two third sub-pixels adjacent to the second sub-pixel along a diagonal direction has centrosymmetry or mirror symmetry about the geometric center of the second sub-pixel.

14. The pixel structure according to claim 1, wherein:

an area of the first sub-pixel is equal to an area of the third sub-pixel group; and an area of the second sub-pixel is smaller than the area of the first sub-pixel.

15. The pixel structure according to claim 3, wherein:

each of the first sub-pixel, the third sub-pixel string, and the second sub-pixel is connected with a data line for receiving pixel display information; and the third sub-pixels of a same third sub-pixel string receive a same display information.

16. A method for displaying the pixel structure in claim 1, wherein in the pixel structure:

third sub-pixels positioned on a same side of a central axis of the first sub-pixel and neighboring the first sub-pixel form a third sub-pixel string, the third sub-pixels in the third sub-pixel string displaying a same color;

a display unit includes the first sub-pixel, a second sub-pixel adjacent to the first sub-pixel, and the third sub-pixel string neighboring the first sub-pixel; and adjacent display units share the first sub-pixel and the third sub-pixel string such that each display unit displays pixel display information containing three colors.

17. The method according to claim 16, including steps S1 to S3, wherein:

in step S1, obtaining theoretical brightness values for each pixel unit from the pixel display information, the theoretical brightness values corresponding to colors displayed by the first sub-pixel, the second sub-pixel, and the third sub-pixel string;

in step S2, calculating actual brightness values of the first sub-pixel, the second sub-pixel, and the third sub-pixel string of each pixel unit; and in step S3, inputting the actual brightness values to the first sub-pixel, the second sub-pixel, and the third sub-pixel string of each pixel unit to display images.

18. The method according to claim 17, wherein in step S2:

the actual brightness value of the first sub-pixel is calculated as a sum of weighted theoretical brightness value of each shared portion of the first sub-pixel;

the actual brightness value of the second sub-pixel is the theoretical brightness value corresponding to the color displayed by the second sub-pixel; and the actual brightness value of the third sub-pixel string is calculated as a sum of weighted theoretical brightness values of each shared portion of the third sub-pixel string.

19. The method according to claim 18, wherein in step S2:

four adjacent display units share one first sub-pixel, a weight of each shared portion of the first sub-pixel corresponding to a theoretical brightness value of the shared portion and the weight is ¼.

20. The method according to claim 18, wherein in step S2:

the third sub-pixel string includes two adjacent third sub-pixels along a diagonal direction, each of the two adjacent third sub-pixels being contained in a different third sub-pixel group;

the second sub-pixel, a third sub-pixel string having the shortest distance to the second sub-pixel, and two first sub-pixels positioned on two sides of the second sub-pixel in two adjacent rows and each having the shortest distance to the second sub-pixel along a diagonal direction form a display unit;

the third sub-pixel string of the display unit neighboring the second sub-pixel is shared by an adjacent display unit in an upper adjacent display unit row, a lower adjacent display unit row, an upper adjacent display unit column, a lower adjacent display unit column, or a combination thereof; and a weight for the theoretical brightness value of each shared portion of the third sub-pixel in the third sub-pixel string is ½.

21. The method according to claim 18, wherein in step S2:

the third sub-pixel string includes three sub-pixels neighboring a first sub-pixel, the three third sub-pixels being positioned on a same side of a central axis of the first sub-pixel and each of the three third sub-pixels being contained in a different third sub-pixel group;

two of the third sub-pixels are aligned along one diagonal direction;

two of the third sub-pixels are aligned along another diagonal direction, one of the third sub-pixels being positioned on a crossing of two diagonal directions;

the second sub-pixel, two adjacent first sub-pixels positioned on two sides of the second sub-pixel in two adjacent rows and each having a shortest distance to the second sub-pixel along a diagonal direction, and a third sub-pixel string having a shortest distance to the second sub-pixel forms a display unit;

each of three second sub-pixels aligned in one row or one column and neighboring the third sub-pixel string is contained in a display unit, each of the display units containing one of the three second sub-pixels sharing the third sub-pixel string by shared portion of the third sub-pixel string; and a weight of the theoretical brightness value for a color displayed by a shared portion of the third sub-pixel string in each of the three display units is ⅓.

22. A display apparatus, including the pixel structure of claim 1.

23. A method for displaying a pixel structure comprising first sub-pixels, second sub-pixels, and third sub-pixels, wherein in the pixel structure:
  two adjacent third sub-pixels facing each other form a third sub-pixel group;
  the second sub-pixels are arranged in a row along a direction of a first axis to form second-sub-pixel rows, the first sub-pixels and the third sub-pixel groups are arranged in an alternating configuration along the direction of the first axis parallel to the second-sub-pixel rows, and the second-sub-pixel rows and rows formed by the first sub-pixels and the third sub-pixel groups are arranged in an alternating configuration;
  the second sub-pixels are arranged along a direction of a second axis to form second-sub-pixel columns, the first sub-pixels and the third sub-pixel groups are arranged in an alternating configuration along the direction of the second axis parallel to the second-sub-pixel columns, the second-sub-pixel columns and columns formed by the first sub-pixels and the third sub-pixel groups are arranged in an alternating configuration;
  geometric center of each second sub-pixel is positioned on a perpendicular bisector of a line connecting centers of any two of adjacent third sub-pixel groups and first sub-pixels; and
  at least two of the third sub-pixels neighboring the first sub-pixel and positioned on a same side of a central axis of the first sub-pixel are connected with direct connection lines to form a third sub-pixel string, the third sub-pixel string displaying a same color;
  the first axis is different from the second axis;
  third sub-pixels positioned on a same side of a central axis of the first sub-pixel and neighboring the first sub-pixel form a third sub-pixel string, the third sub-pixels in the third sub-pixel string displaying a same color;
  a display unit includes the first sub-pixel, a second sub-pixel adjacent to the first sub-pixel, and the third sub-pixel string neighboring the first sub-pixel; and
  adjacent display units share the first sub-pixel and the third sub-pixel string such that each display unit displays pixel display information containing three colors, and
wherein the method includes:
  obtaining theoretical brightness values for each pixel unit from the pixel display information, the theoretical brightness values corresponding to colors displayed by the first sub-pixel, the second sub-pixel, and the third sub-pixel string;
  calculating actual brightness values of the first sub-pixel, the second sub-pixel, and the third sub-pixel string of each pixel unit; and
  inputting the actual brightness values to the first sub-pixel, the second sub-pixel, and the third sub-pixel string of each pixel unit to display images.

* * * * *